(12) United States Patent
Goto et al.

(10) Patent No.: US 10,128,770 B2
(45) Date of Patent: Nov. 13, 2018

(54) CONVERTER AND ELECTRIC POWER CONVERSION APPARATUS

(71) Applicant: HITACHI AUTOMOTIVE SYSTEMS, LTD., Hitachinaka-shi, Ibaraki (JP)

(72) Inventors: Akihiro Goto, Hitachinaka (JP); Yoshiharu Yamashita, Hitachinaka (JP); Hidenori Shinohara, Hitachinaka (JP); Tadahiko Chida, Tokyo (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 221 days.

(21) Appl. No.: 15/302,806

(22) PCT Filed: Apr. 8, 2015

(86) PCT No.: PCT/JP2015/060911
§ 371 (c)(1),
(2) Date: Oct. 7, 2016

(87) PCT Pub. No.: WO2015/163143
PCT Pub. Date: Oct. 29, 2015

(65) Prior Publication Data
US 2017/0040907 A1    Feb. 9, 2017

(30) Foreign Application Priority Data

Apr. 25, 2014 (JP) .................. 2014-091946

(51) Int. Cl.
*H05K 7/00* (2006.01)
*H02M 7/00* (2006.01)
(Continued)

(52) U.S. Cl.
CPC .............. *H02M 7/003* (2013.01); *H02M 3/28* (2013.01); *H02M 7/44* (2013.01); *H05K 7/20927* (2013.01)

(58) Field of Classification Search
CPC .......... H02M 7/003; H02M 3/28; H02M 7/44; H05K 7/20927
See application file for complete search history.

(56) References Cited

U.S. PATENT DOCUMENTS 5,754,414 A * 5/1998 Hanington .............. H02M 3/28
                                                      323/282
6,144,269 A * 11/2000 Okamoto ................ H02M 1/12
                                                      333/184
(Continued)

FOREIGN PATENT DOCUMENTS

JP          10-305009 A      11/1998
JP         2011-239485 A    11/2011
(Continued)

*Primary Examiner* — James Wu
*Assistant Examiner* — Hung Dang
(74) *Attorney, Agent, or Firm* — Foley & Lardner, LLP

(57) ABSTRACT

An adverse effect on a smoothing capacitor device caused by heat is suppressed. A flow path forming body 240 provided with protruding portions 411, 412 for attaching a capacitor board, a smoothing inductor device 130 mounted on the flow path forming body 240, and a capacitor board 170A on which a smoothing capacitor device 170 is implemented are provided, and the capacitor board 170A is fixed to the protruding portions 411, 412 for attaching the capacitor board, in such a manner that the smoothing capacitor device 170 is away from the flow path forming body 240.

6 Claims, 16 Drawing Sheets

(51) Int. Cl.
    *H02M 3/28*     (2006.01)
    *H02M 7/44*     (2006.01)
    *H05K 7/20*     (2006.01)

(56) References Cited

U.S. PATENT DOCUMENTS

| | | | | |
|---|---|---|---|---|
| 6,972,957 | B2 * | 12/2005 | Beihoff | B60L 11/12 |
| | | | | 165/104.33 |
| 9,237,669 | B2 * | 1/2016 | Iwata | H02M 7/003 |
| 9,350,228 | B2 * | 5/2016 | Uetake | H02M 7/003 |
| 9,847,730 | B2 * | 12/2017 | Namba | H02M 3/33546 |
| 2014/0126154 | A1 | 5/2014 | Higuchi et al. | |

FOREIGN PATENT DOCUMENTS

| | | | |
|---|---|---|---|
| JP | 2012-191768 | A | 10/2012 |
| JP | 2013-031250 | A | 2/2013 |

\* cited by examiner

CONVERTER AND ELECTRIC POWER CONVERSION APPARATUS

TECHNICAL FIELD

The present invention relates to a converter, and more particularly, a converter provided on a vehicle and the like, and an electric power conversion apparatus including the converter.

BACKGROUND ART

Vehicles such as a hybrid car, a plug-in hybrid car, and an electric automobile are provided with a power driving high voltage battery, an inverter apparatus, a DC-DC converter, and a low voltage battery serving as an auxiliary power source for a low voltage load.

The sizes of the inverter apparatus and the converter are reduced to reduce the ratio of the footprint with respect to the vehicle, so that the inverter apparatus and the converter can be mounted in a small space outside of a cabin. The converter is provided with an inductor device and a capacitor device for smoothing and filtering. The capacitor device is adversely affected by heat emitted by a heating body such as an inductor device, but when the size is reduced, the capacitor device is further more likely to be affected by heat, and therefore, it is an important problem to cope with this issue.

There is a known structure as a conventional electric power conversion apparatus, in which a power semiconductor device, a heat sink, a reactor, and a capacitor, which are in the descending order of heat generation, are arranged in order from the top to be disposed in a stacked manner in a vertical direction and accommodated in a housing. According to this structure, the air heated by the power semiconductor device is less likely to move to around the capacitor arranged at the lower side, and therefore, this structure is considered to improve the reliability (for example, see PTL 1).

CITATION LIST

Patent Literature

PTL 1: JP-2011-239485-A

SUMMARY OF INVENTION

Technical Problem

The electric power conversion apparatus descried in PTL 1 employs a structure in which components are stacked and arranged in the vertical direction in the descending order of heat generation to be accommodated in the housing. However, in general, in the converter, the components are supported in the horizontal direction, and accommodated in the housing. As described above, the structure in which the heat generating component and the capacitor are arranged in the horizontal direction cannot suppress adverse effects of heat to the capacitor due to heat generating body.

Solution to Problem

A converter according to the present invention includes: a smoothing inductor provided and cooled on a metal base; a smoothing capacitor implemented on a capacitor board; and an installation member installing the capacitor board on the metal base so that a predetermined space is ensured between the capacitor board and the metal base.

An electric power conversion apparatus according to the present invention includes a converter including a metal base provided with a cooling flow path, a smoothing inductor provided on the metal base and cooled by a refrigerant in the cooling flow path, a smoothing capacitor implemented on a capacitor board, and an installation member installing the capacitor board on the metal base so that a predetermined space is ensured between the capacitor board and the metal base, a power module inserted into a refrigerant flow path of the metal base to be cooled and converting a direct current electric power into an alternate current electric power, and a smoothing capacitor provided at a stage before the power module and cooled by the refrigerant in the cooling flow path.

Advantageous Effects of Invention

According to the present invention, an adverse effect on a smoothing capacitor device caused by surrounding heat can be suppressed.

BRIEF DESCRIPTION OF DRAWINGS

FIG. 4(A) is a figure in which aside surface is at the front, and FIG. 4(B) is a figure in which a surface opposite to FIG. 4(A) is at the front.

FIG. 6(A) is a top view seen from above, FIG. 6(B) is a perspective view seen from above, and FIG. 6(C) is a perspective view seen from a bottom surface side.

DESCRIPTION OF EMBODIMENTS

[Example of System of Hybrid Automobile Provided with Electric Power Conversion Apparatus]

A DC-DC converter is applied to an electric power conversion apparatus provided on a system of a hybrid automobile.

First, the system of the hybrid automobile will be explained.

Figure 1:
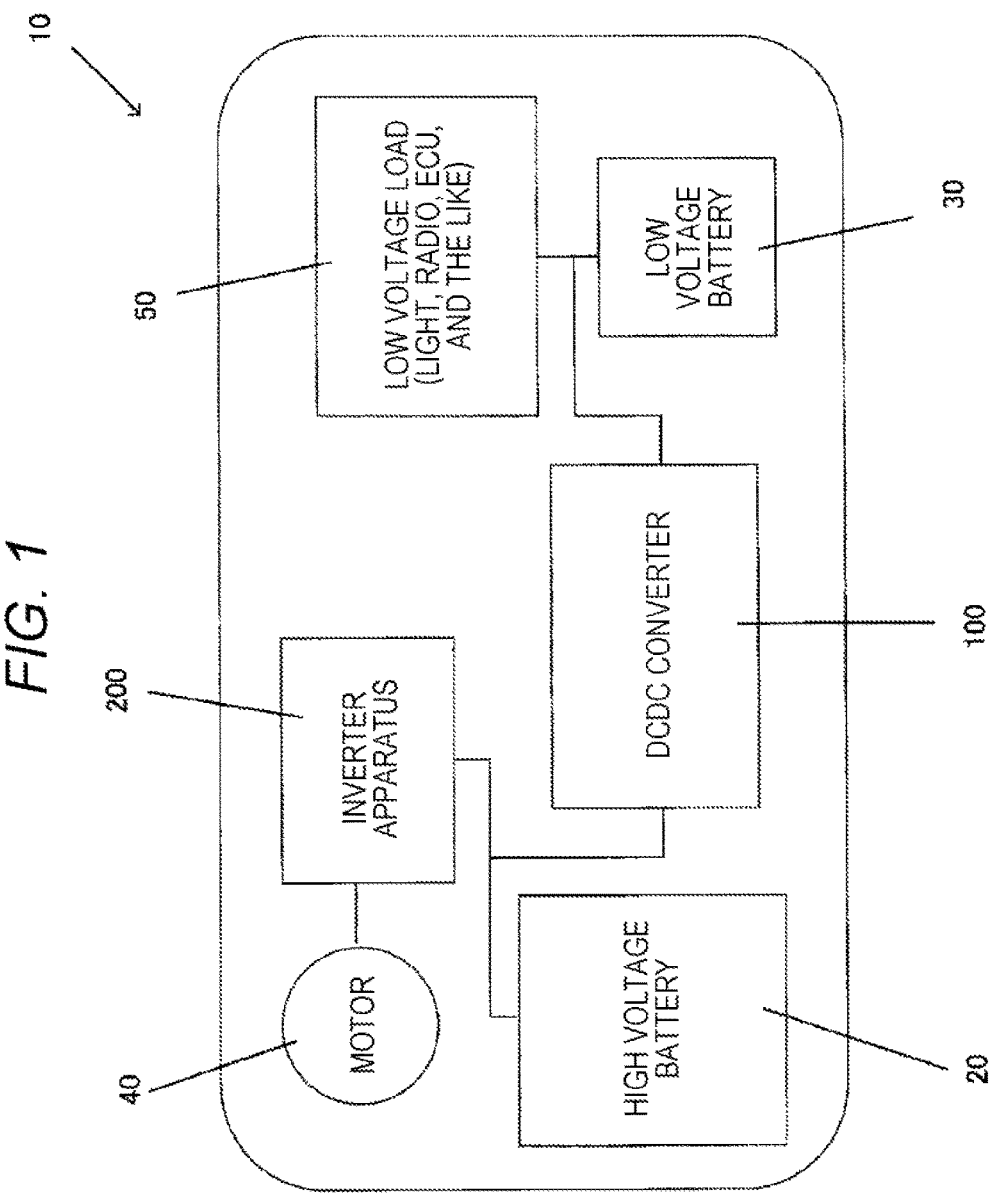
FIG. 1 is a system diagram illustrating a system of a hybrid automobile.

FIG. 1 is a system diagram illustrating the system of the hybrid automobile.

A vehicle 10 such as a hybrid car, a plug-in hybrid car, and an electric automobile is provided with a power driving high voltage battery 20, an inverter apparatus 200, a DC-DC converter 100, and a low voltage battery 30 serving as an auxiliary power source for a low voltage load 50.

The high voltage battery 20 is connected to the inverter apparatus 200 and a DC-DC converter 100. The inverter apparatus 200 converts a direct current high voltage output of the high voltage battery 20 into an alternate current high voltage output, and drives a motor 40.

The DC-DC converter 100 includes a conversion unit for converting a direct current voltage of a high voltage from the high voltage battery 20 into an alternate current high voltage, a conversion unit for converting the alternate current high voltage into an alternate current low voltage, a conversion unit for converting an alternate current low voltage into a direct current low voltage, and an output terminal for outputting the converted voltage.

The output terminal of the DC-DC converter 100 is connected to the low voltage battery 30 and the low voltage load 50, and provides electric power to the low voltage load 50 such as lights, a radio, and an ECU of the vehicle 10, and charges the low voltage battery 30.

The inverter apparatus 200 and the DC-DC converter 100 are integrated as an electric power conversion apparatus 300, as explained later, and assembled. The electric power conversion apparatus 300 preferably has such a structure that the electric power conversion apparatus 300 can be mounted on a space as small as possible so that the ratio of the space of the cabin with respect to the entire vehicle 10 is increased as much as possible to improve the interior comfort.

[Inverter Circuit Unit]

The inverter apparatus 200 will be explained with reference to FIG. 2. The inverter apparatus 200 includes an inverter circuit unit 200K, a capacitor module 230, a direct current terminal 260a, and an alternate current terminal 270a. The inverter circuit unit 200K includes a semiconductor module 220 of an upper lower arm including an IGBT (Insulated Gate Bipolar Transistor) 328 and a diode 156 operating as an upper arm and an IGBT 330 and a diode 166 operating as a lower arm in such a manner that the semiconductor modules 220 are provided in association with three phases including U-phase, V-phase, W-phase of an alternate current electric power which is to be output.

A collector electrode 153 of the IGBT 328 of the upper arm is electrically connected to a positive pole side capacitor terminal 230h of the capacitor module 230 via a positive pole terminal 157. An emitter electrode 165 of the IGBT 330 of the lower arm is electrically connected to a negative pole side capacitor terminal 230i of the capacitor module 230 via a negative pole terminal 158.

An inverter control circuit unit 205 receives a control command via a connector 201 from a host control apparatus (not shown), and on the basis of this, the inverter control circuit unit 205 generates a control pulse which is a control signal for controlling the IGBT 328 and the IGBT 330 constituting the upper arm or the lower arm of the semiconductor module 220 of the phases constituting the inverter circuit unit 200K, and provides the control pulse to the driver circuit unit 250.

On the basis of the control pulse, the driver circuit unit 250 provides, to the IGBT 328 and the IGBT 330 of the phases, a driver pulse for controlling the IGBT 328 and the IGBT 330 constituting the upper armor the lower arm of the semiconductor module 220 of each phase.

The IGBT 328 and the IGBT 330 perform conduction or breaking operation on the basis of the driver pulse from the driver circuit unit 250, convert the direct current electric power provided from the high voltage battery 20 into a three-phase alternate current electric power, and provide this converted electric power via three alternate current terminals 270a to the motor generator MG1.

The IGBT 328 includes a collector electrode 153, a signal emitter electrode 155, and a gate electrode 154. The IGBT 330 includes a collector electrode 163, an emitter electrode 165 of a signal, and a gate electrode 164.

The diode 156 is electrically connected between the collector electrode 153 and the emitter electrode 155. The diode 166 is electrically connected between the collector electrode 163 and the emitter electrode 165.

An electric current sensor 280 for detecting the electric current which is output from each semiconductor module 220 is arranged between each semiconductor module 220 and the alternate current terminal 270a.

The capacitor module 230 includes a positive pole side capacitor terminal 230h, a negative pole side capacitor terminal 230i, a positive pole side power source terminal 230j, and a negative pole side power source terminal 230k. The direct current electric power of the high voltage from the high voltage battery 20 is provided via the direct current terminal 260a to a positive pole side power source terminal 230j and a negative pole side power source terminal 230k, and is provided from the positive pole side capacitor terminal 230h and the negative pole side capacitor terminal 230i of the capacitor module 230 to the inverter circuit unit 200K.

[DC-DC Converter Circuit Unit]

Figure 3:
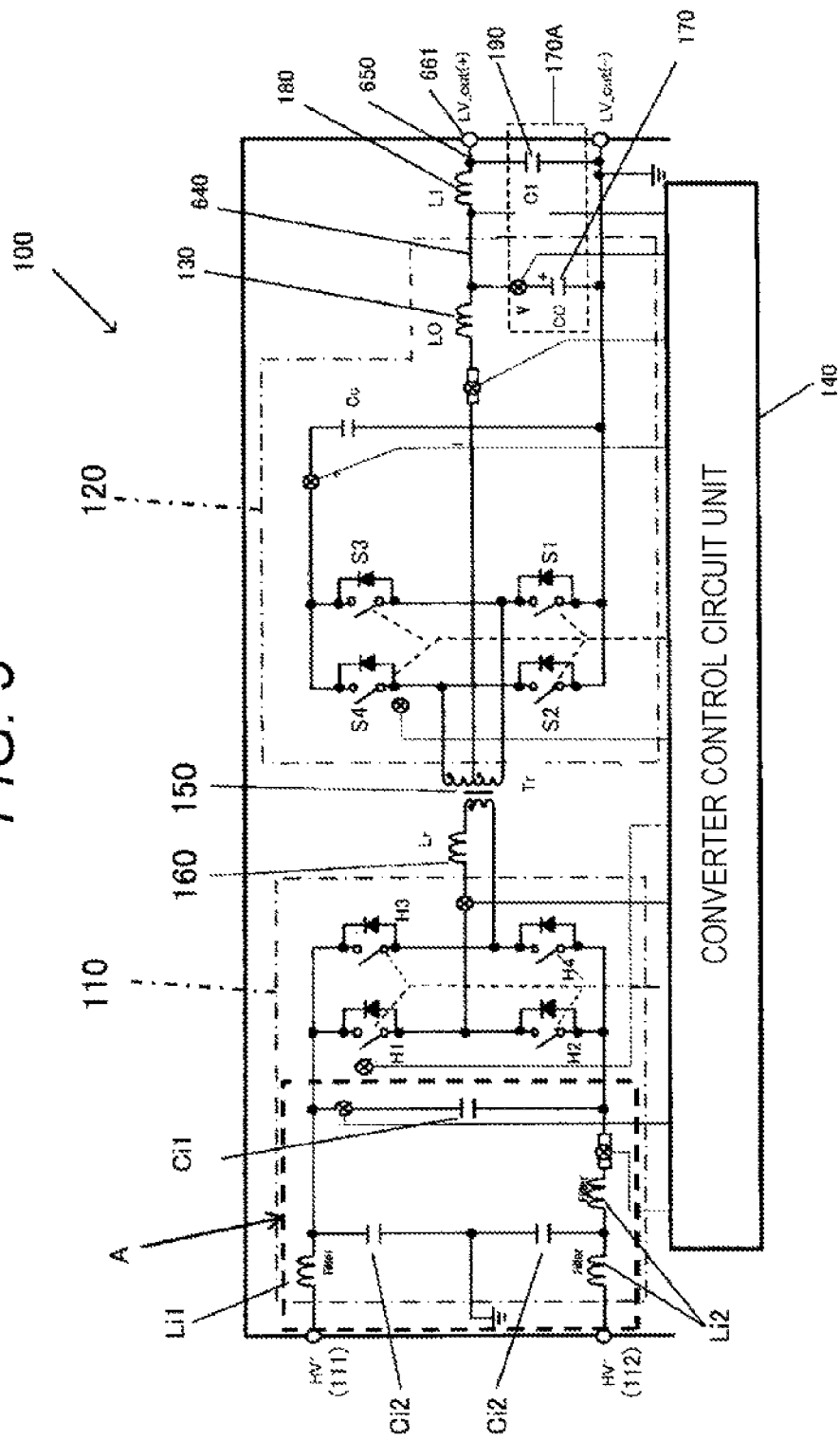
FIG. 3 is a circuit diagram illustrating a configuration of an electric circuit of a DC-DC converter.

FIG. 3 is a circuit diagram illustrating a configuration of the electric circuit of the DC-DC converter 100.

The DC-DC converter 100 includes a high voltage circuit unit 110 converting the direct current voltage of the high voltage from the high voltage battery 20 into an alternate current high voltage, a transformer Tr (150) for converting the alternate current high voltage into an alternate current low voltage, a low voltage circuit unit 120 converting the alternate current voltage of the low voltage into a direct current voltage, and a converter control circuit unit 140.

The high voltage circuit unit 110 includes four MOSFETs (field-effect transistors) H1 to H4 connected in an H bridge type.

Normally, a DC-DC converter includes, as smoothing input capacitors, an X capacitor Ci1 interposed between the phases of HV$^+$ and HV$^-$ and two Y capacitors Ci2 interposed between each phase and the chassis. In addition, it is necessary to provide a normal mode coil Li1 and two common mold coils Li2.

However, as explained later, according to an embodiment of the present invention, the capacitor module 230 of the inverter apparatus 200 and the high voltage circuit unit 110 are configured to be disposed in proximity to each other, so that the wiring inductor for connection can be reduced. According to this configuration, both of the functions of the X capacitor Ci1 and the two two Y capacitors Ci2 can be achieved by the capacitor module 230 of the inverter apparatus 200. For this reason, the X and Y capacitors Ci1, Ci2 can be eliminated from the high voltage circuit unit 110 of the DC-DC converter 100. Since the noise during input can be reduced, the normal mode coil Li1 and the two common mode coils Li2 can also be eliminated from the high voltage circuit unit 110 of the DC-DC converter 100. More specifically, in the DC-DC converter 100 according to an embodiment of the present invention, in FIG. 3, circuit elements in an area A enclosed by a dotted line are eliminated.

Four MOSFETs H1 to H4 of the high voltage circuit unit 110 are controlled in phase shift PWM control, so that an alternate current voltage is generated at the primary side of the transformer Tr (150). A resonant choke coil Lr (160) is connected between the high voltage circuit unit 110 and the transformer Tr (150), and zero voltage switching can be performed with the MOSFETs H1 to H4 constituting the high voltage circuit unit 110 by using a combined inductor of the inductor of the resonant choke coil Lr (160) and the leakage inductor of the transformer Tr (150).

The low voltage circuit unit 120 includes two rectified phases constituted by the MOSFETs S1, S2 and a smoothing circuit constituted by a smoothing inductor L0 (130) and a smoothing capacitor C0 (170). A high potential side of each rectified phase, i.e., the drain side wirings of the MOSFETs S1, S2, are connected to the secondary side of the transformer Tr (150). The secondary side center tap terminal of the transformer Tr (150) is connected to the smoothing inductor L0 (130), and the smoothing capacitor C0 (170) is connected to the output side of the smoothing inductor L0 (130).

The low voltage circuit unit 120 includes an active clamp circuit for suppressing a surge voltage applied to the MOSFETs S1, S2. The active clamp circuit includes active clamp MOSFETs S3, S4, and an active clamp capacitor Cc.

At the output side of the low voltage circuit unit 120, a filter inductor L1 (180) and a filter capacitor C1 (190) are provided in order to remove a noise superimposed on the output voltage. The high voltage circuit unit 110, the low voltage circuit unit 120, and the active clamp circuit are controlled and switched by the converter control circuit unit 140.

[Entire Structure of Electric Power Conversion Apparatus 300]

FIGS. 4(A) and 4(B) are external appearance perspective views seen from above, of the electric power conversion apparatus 300. FIG. 4(A) is a figure in which a side surface is at the front, and FIG. 4(B) is a figure in which a surface opposite to FIG. 4(A) is at the front.

Figure 5:
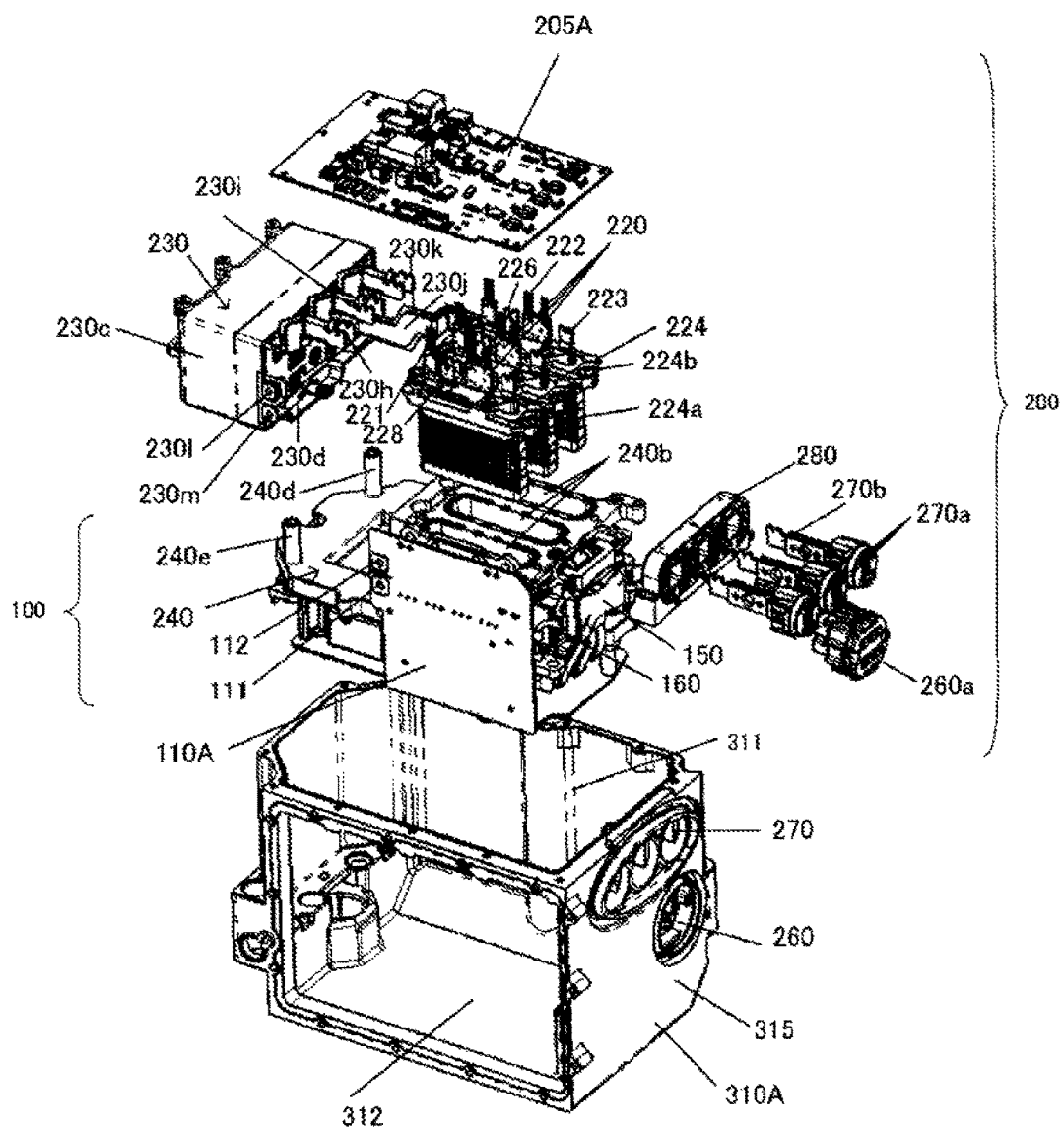
FIG. 5 is an exploded perspective view illustrating an internal structure of an electric power conversion apparatus illustrated in FIG. 4.

The electric power conversion apparatus 300 includes the inverter apparatus 200 and the DC-DC converter 100 accommodated in the housing 310 (see FIG. 5). The housing 310 is made of, for example, casting of metal such as aluminum alloy. The housing 310 includes a box-shaped main body portion 310A having an upper portion aperture portion 311 (see FIG. 5) formed at an upper portion thereof and having a side portion aperture portion 312 (see FIG. 5) at a side surface thereof, an upper portion cover 320 for closing the upper portion aperture portion 311 of the main body portion 310A, and a side portion cover 330 for closing the side portion aperture portion 312. A direct current side accommodation unit 260 for accommodating the direct current terminal 260a explained later and an alternate current side accommodation unit 270 for accommodating the alternate current terminal 270a are provided at a side portion 315 of the main body portion 310A. The upper portion cover 320 and the side portion cover 330 are fixed to the main body portion 310A with a fastening member such as a screw with a seal member, not shown, interposed therebetween. A refrigerant inlet pipe 240e and a refrigerant outlet pipe 240d of a flow path forming body 240 (see FIG. 5) explained later are extended from one side surface of the housing 310.

[Inverter Apparatus 200]

Figure 4:
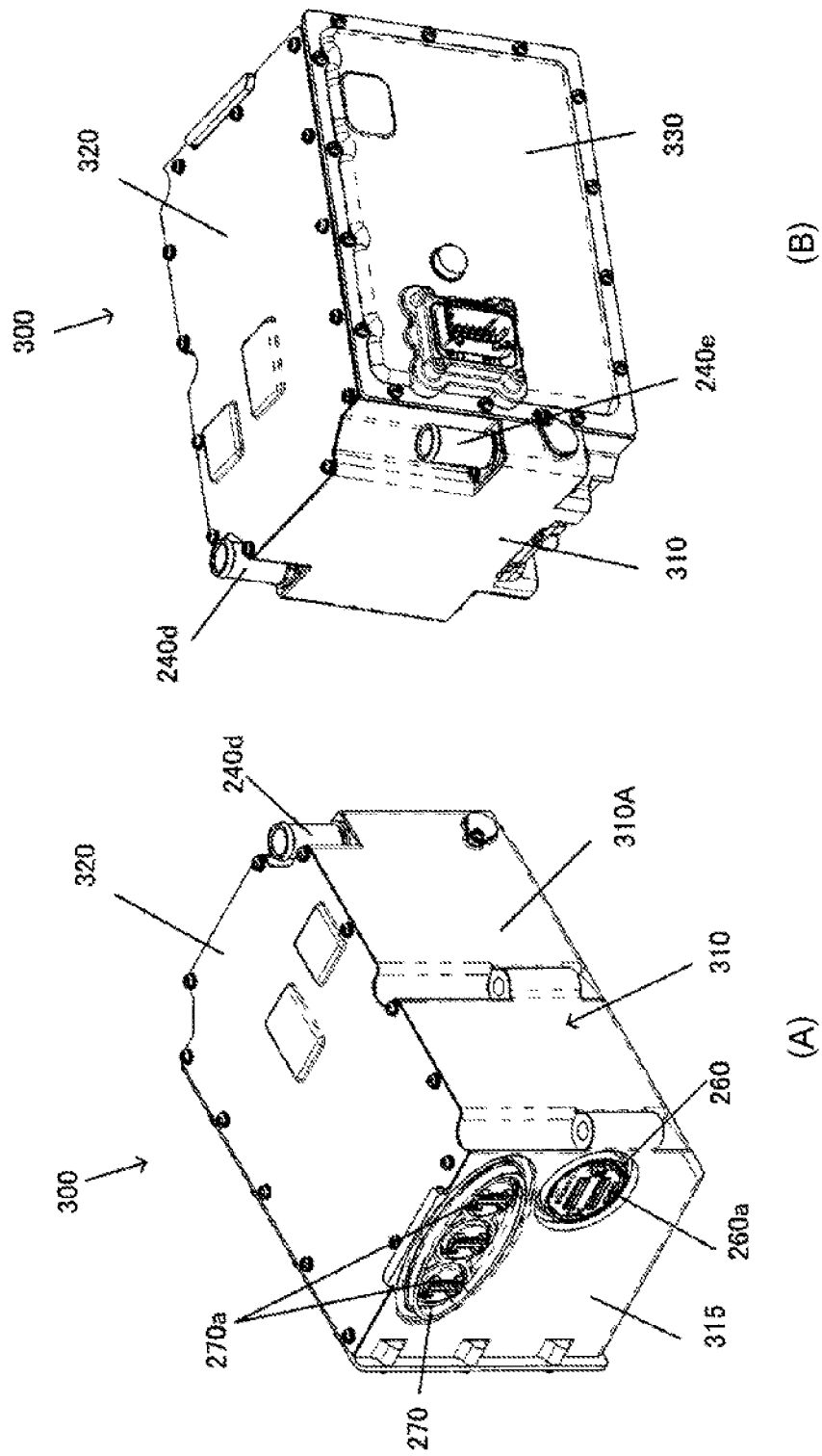
FIGS. 4(A) and 4(B) are external appearance perspective views seen from above, of an electric power conversion apparatus provided with a converter according to the present invention.
Figure 9:
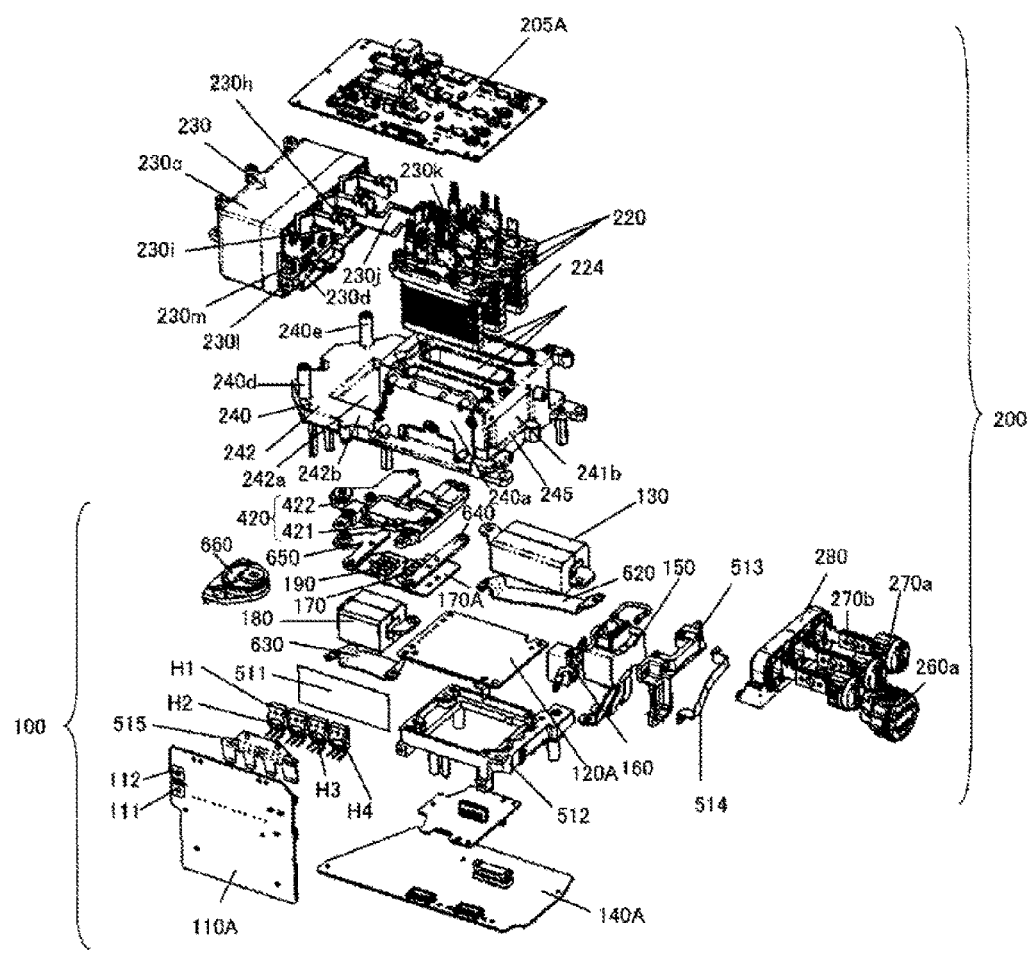
FIG. 9 is a perspective view obtained by further exploding the electric power conversion apparatus as illustrated in FIG. 5.

FIG. 5 is an exploded perspective view illustrating an internal structure of the electric power conversion apparatus 300 as illustrated in FIG. 4. FIG. 9 is a perspective view obtained by further exploding the electric power conversion apparatus 300 illustrated in FIG. 5.

The inverter apparatus 200 includes the flow path forming body 240, the semiconductor modules 220 (three semiconductor modules 220 in the present embodiment), the capacitor module 230, and an inverter control circuit board 205A. The inverter apparatus 200 includes a direct current terminal 260a, three alternate current terminals 270a, and an electric current sensor 280.

The metal base 240 constituting the flow path forming body is made of casting of metal such as aluminum alloy. The semiconductor modules 220, the capacitor module 230, and the inverter control circuit board 205A are attached to the flow path forming body 240. The direct current terminal 260a is accommodated in the direct current side accommodation unit 260 of the main body portion 310A of the housing 310, and is connected to the capacitor module 230. Each of the three alternate current terminals 270a is accommodated in the alternate current side accommodation unit 270 of the main body portion 310A of the housing 310, and is connected to a corresponding semiconductor module 220 via an alternate current connection bus bar 270b.

Figure 2:
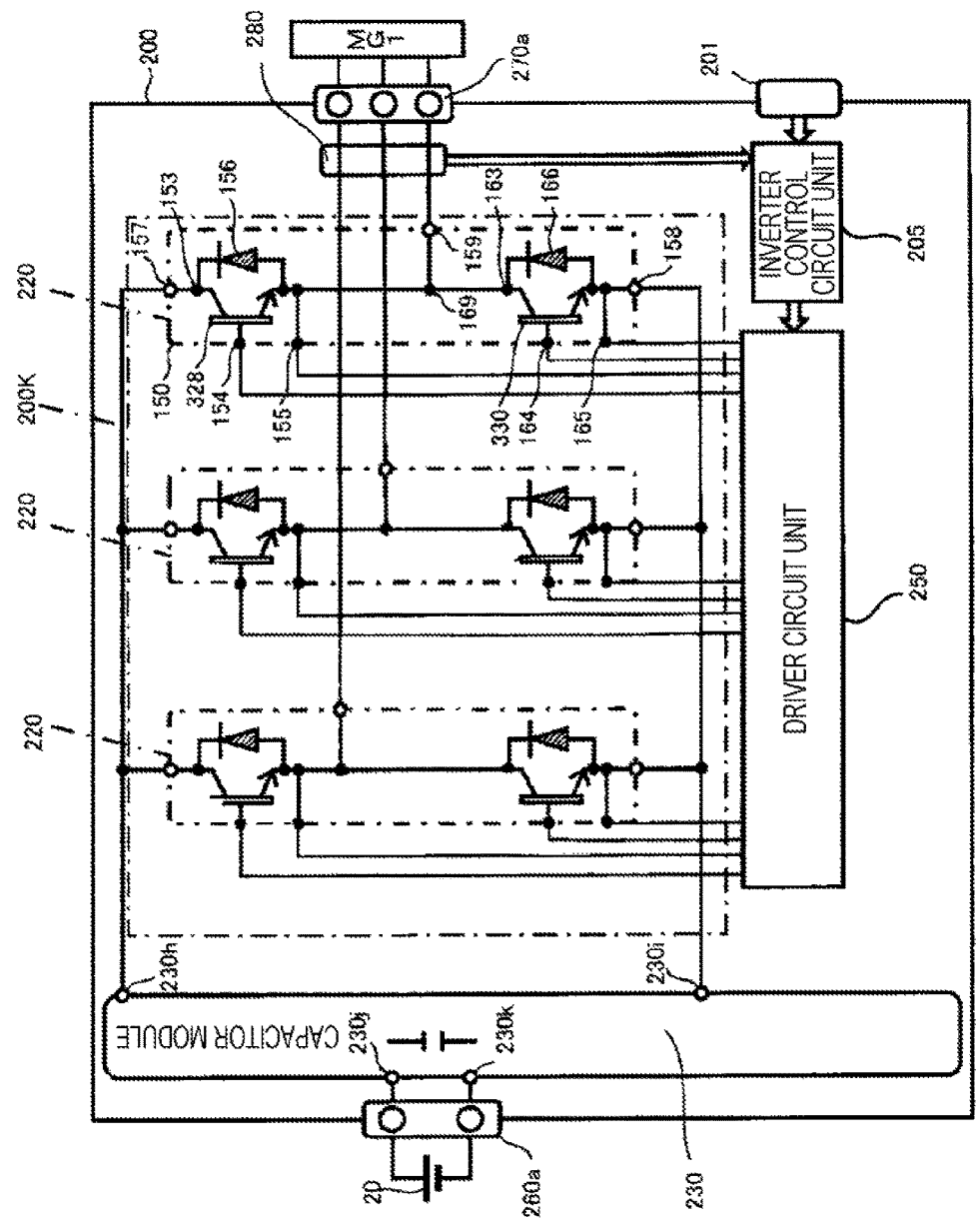
FIG. 2 is a circuit block diagram for explaining a configuration of an inverter apparatus.

The inverter control circuit board 205A has a circuit unit constituting the driver circuit unit 250 and the inverter control circuit unit 205 of FIG. 2.

Each semiconductor module 220 includes a member having an electric conductivity, for example, a module case 224 constituted by an aluminum alloymaterial (Al, AlSi, AlSiC, Al—C, and the like). The module case 224 includes a thin box shaped case main body 224a and a flange 224b formed at an upper portion side. An external peripheral side edge of the flange 224b is formed to be larger than the external peripheral side surface of the case main body 224a by one size, and protrudes from the external peripheral side surface of the case main body 224a. Although not shown in the drawing, the case main body 224a is formed with many heat radiation fins on both of the front and back surfaces to enhance the heat radiation property. The IGBTs 328, 330, and the diodes 156, 166 are accommodated in the case main body 224a, and insulating resin (not shown) is filled therein.

The semiconductor module 220 includes multiple signal terminals 221, 222 extending to the outside from the upper surface of the insulating resin 229 and connected to the IGBTs 328, 330, respectively. The signal terminals 221, 222 are connected to the IGBTs 328, 330, respectively, via bonding wires in the case main body 224a.

The signal terminal 221 corresponds to the gate electrode 154 and the signal emitter electrode 155 illustrated in FIG. 2. The signal terminal 222 corresponds to the gate electrode 164 and the emitter electrode 165 illustrated in FIG. 2. The direct current positive pole terminal 226 corresponds to the positive pole terminal 157 illustrated in FIG. 2. The direct current negative pole terminal 228 corresponds to the negative pole terminal 158 illustrated in FIG. 2. The alternate current terminal 223 corresponds to the alternate current terminal 159 illustrated in FIG. 2.

The direct current positive pole terminal 226 is connected to the positive pole side capacitor terminal 230*h* (see FIG. 2) of the capacitor module 230. The direct current negative pole terminal 228 is connected to the negative pole side capacitor terminal 230*i* (see FIG. 2) of the capacitor module 230. The alternate current terminal 223 provides an alternate current electric power to the motor generator MG1 via the alternate current terminal 270*a*. Further, each of the signal terminals 221, 222 is connected to the driver circuit unit 250.

The signal terminals 221, 222, the direct current positive and negative pole terminals 226, 228, and the alternate current terminal 223 are integrated by resin formation, and are fixed to the flange 224*b* of the module case 224 with fastening members such as screws.

The case main body 224*a* of the metal module case 224 in the semiconductor module 220 is inserted into an aperture portion 240*b* in communication with the cooling flow path of the flow path forming body 240 in which refrigerant such as water and oil flows, and the flange 224*b* is fixed to the upper surface of the flow path forming body 240 with a seal member, not shown, interposed therebetween.

(Flow Path Forming Body 240)

Figure 6:
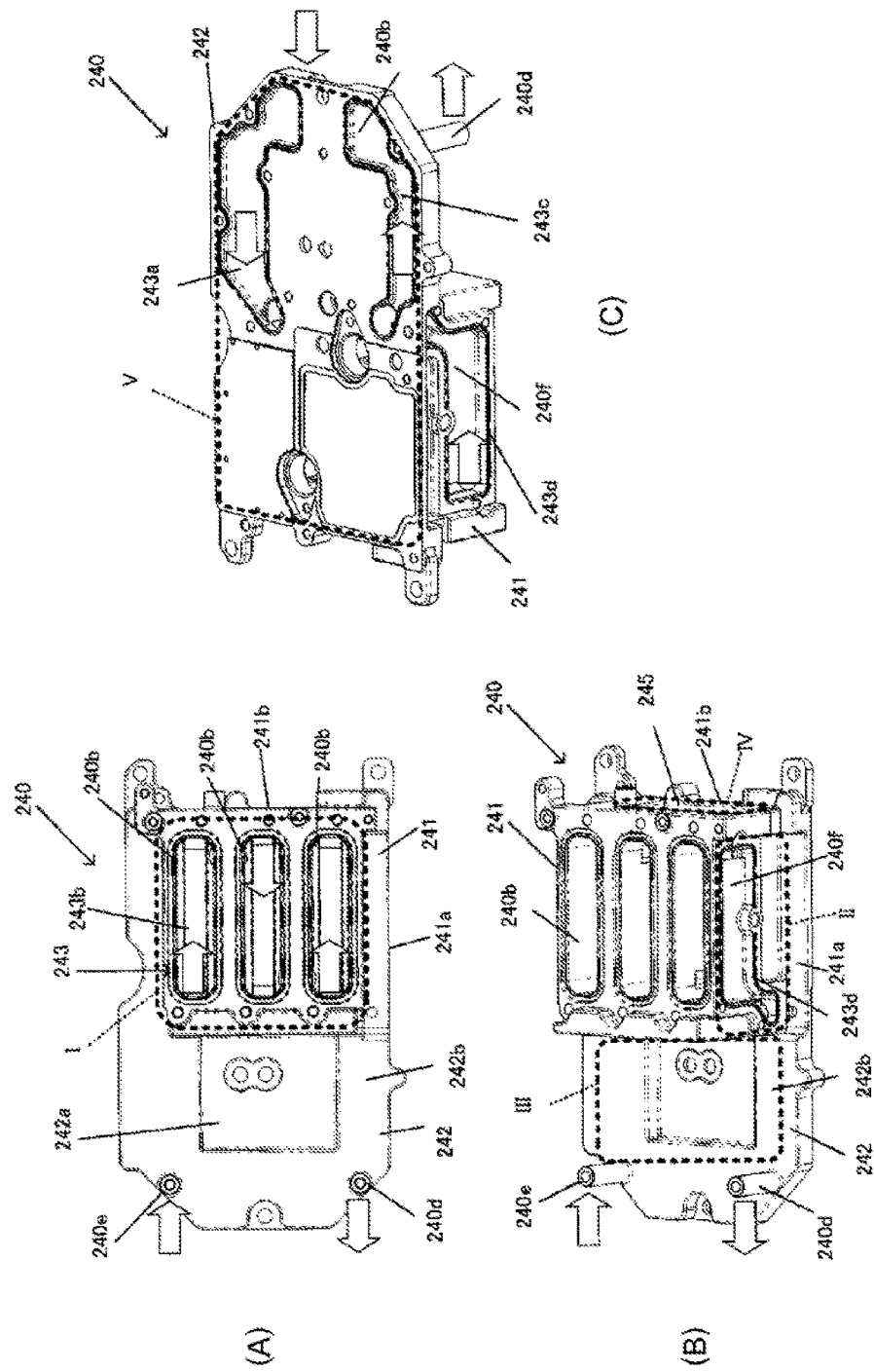
FIGS. 6(A) to 6(C) are figures illustrating a flow path forming body illustrated in FIG. 5.

FIGS. 6(A) to 6(C) are figures illustrating the flow path forming body 240. FIG. 6(A) is a top view seen from above, FIG. 6(B) is a perspective view seen from above. FIG. 6(C) is a perspective view seen from a bottom surface side.

The flow path forming body 240 includes a semiconductor module attachment unit 241 attached to the semiconductor module 220 and a capacitor module attachment unit 242 attached to the capacitor module 230.

The semiconductor module attachment unit 241 is formed to be thicker than the capacitor module attachment unit 242. The three aperture portions 240*b* into which the semiconductor modules 220 are inserted are formed at the upper portion side of the semiconductor module attachment unit 241.

The refrigerant inlet pipe 240*e* and the refrigerant outlet pipe 240*d* are formed at the end of the capacitor module attachment unit 242. A groove portion 242*a* is formed substantially at the center of the capacitor module attachment unit 242.

A cooling flow path 243 in which refrigerant such as water and oil flows is formed in the inside of the flow path forming body 240. The cooling flow path 243 includes a semiconductor module cooling flow path 243*b* formed to meander in a zigzag manner in the three aperture portions 240*b*, an inlet side cooling flow path 243*a* forming a flow path from the refrigerant inlet pipe 240*e* to the semiconductor module cooling flow path 243*b*, and an outlet side cooling flow path 243*c* forming a flow path from the semiconductor module cooling flow path 243*b* to the refrigerant outlet pipe 240*d*. Each of the inlet side cooling flow path 243*a* and the outlet side cooling flow path 243*c* is exposed from the lower surface of the flow path forming body 240. The exposed surface surfaces of the inlet side cooling flow path 243*a* and the outlet side cooling flow path 243*c* are sealed by a covering plate, not shown.

The cooling flow path 243 includes a semiconductor device cooling flow path 243*d* extended to the outside of a first side wall 241*a* of the semiconductor module attachment unit 241. More specifically, a recessed portion 240*f* is formed on the external surface of the first side wall 241*a* of the flow path forming body 240, and the cooling flow path 243 is in communication with this recessed portion 240*f*. Therefore, the refrigerant flowing in the cooling flow path 243 flows from the inside of the flow path forming body 240 to the recessed portion 240*f* formed on the external surface of the first side wall 241*a*, and is extended to the inside of the flow path forming body 240. The recessed portion 240*f* of the first side wall 241*a* is sealed by a cover member 240*a* (see FIG. 8(B)), and is made into an area II cooling the MOSFETs H1 to H4.

The three semiconductor modules 220 are attached to an area I at the upper surface side of the semiconductor module attachment unit 241 of the flow path forming body 240. The three aperture portions 240*b* in communication with the cooling flow path 243 are provided in the area I, and the case main body 224*a* of the module case 224 of each semiconductor module 220 is inserted into the inside of each aperture portion 240*b*. Each semiconductor module 220 is fixed to the peripheral portion of the aperture portion 240*b* of the flow path forming body 240 via a seal member, not shown. As described above, the external peripheral side edge of the case main body 224*a* of the module case 224 is formed to be larger than the flange 224*b* by one size, and therefore, the aperture portion 240*b* of the flow path forming body 240 is reliably sealed.

As illustrated by arrows in FIG. 6(A), FIG. 6(B), FIG. 6(C), the refrigerant introduced from the refrigerant inlet pipe 240*e* is guided from the inlet side cooling flow path 243*a* to the semiconductor module cooling flow path 243*b* formed in the area I of the flow path forming body 240. In the semiconductor module cooling flow path 243*b*, the refrigerant flows to meander in a zigzag manner around each semiconductor module 220 to cool the three semiconductor modules 220. Further, the refrigerant flows from the semiconductor module cooling flow path 243*b* to the semiconductor device cooling flow path 243*d* formed in the area II of the flow path forming body 240. Thereafter, the refrigerant flows from the outlet side cooling flow path 243*c* to the refrigerant outlet pipe 240*d*, and is discharged to the outside from the flow path forming body 240.

The flow path forming body 240 further includes an area III for cooling the capacitor module 230, an area IV for cooling the transformer 150 (Tr) and the like, and an area V for cooling the constituent elements of the low voltage circuit unit 120. The area III is provided on an upper surface 242*b* of the capacitor module attachment unit 242. The area IV is provided on a second side wall 241*b* which is a side surface at the side opposite to the capacitor module attachment unit 242 of the semiconductor module attachment unit 241. The area V is provided on the bottom surface of the flow path forming body 240.

The cooling performance achieved by the refrigerant increases in proportional to the flow rate of the refrigerant. Therefore, the depth of the area of the cooling flow path 243 where a large cooling performance is required is formed to be shallower than the other area, so that the flow velocity is increased. When the flow velocity increases, the flow rate of the refrigerant increases, so that the cooling performance can be increased. The heat quantity generated by the semiconductor module 220 is high, and therefore, the semiconductor module cooling flow path 243*b* is formed so that the flow rate of the refrigerant flowing in the flow path is high. The cooling flow path 243 can be configured so that the refrigerant flowing in a portion corresponding to each of the areas I to VI attains an appropriate flow rate.

As shown in FIG. 5, the capacitor module 230 accommodates capacitor cells for smoothing and noise reduction in a capacitor case 230c made of metal.

The capacitor case 230c is attached to the flow path forming body 240 with fastening members such as screws in such a manner that a recessed portion 230d formed on the lower side surface is accommodated in the groove portion 242a (see FIG. 6(A)) of the capacitor module attachment unit 242 of the flow path forming body 240, and both side portions of the recessed portion 230d are in contact with the upper surface 242b of the capacitor module attachment unit 242. As described above, the capacitor case 230c made of metal is attached to the flow path forming body 240 so as to allow heat conduction.

A positive pole side power source terminal 230j, a positive pole side capacitor terminal 230h, and a positive pole side converter terminal 230l connected to the positive pole of the capacitor accommodated in the capacitor module 230 are formed on a surface side of the capacitor module 230 facing the semiconductor module 220. The positive pole side power source terminal 230j is connected to the positive pole of the high voltage battery 20. The positive pole side capacitor terminal 230h is connected to the collector electrode 153 of the IGBT 328 of each of the semiconductor modules 220 constituting the inverter apparatus 200. The positive pole side converter terminal 230l is connected to an input side high voltage terminal 111 of a high voltage circuit board 110A explained later.

A negative pole side power source terminal 230k, a negative pole side capacitor terminal 230i, and a negative pole side converter terminal 230m connected to the negative pole of the capacitor device accommodated in the capacitor module 230 are formed on a surface side of the capacitor module 230 facing the semiconductor module 220. The negative pole side power source terminal 230k is connected to the negative pole of the high voltage battery 20. The negative pole side capacitor terminal 230i is connected to the emitter electrode 165 of the IGBT 330 of each of the semiconductor modules 220 constituting the inverter apparatus 200. The negative pole side converter terminal 230m is connected to the input side low voltage terminal 112 of the high voltage circuit board 110A explained later.

The inverter control circuit board 205A is arranged at the upper portion of the semiconductor module 220 and the capacitor module 230 attached to the flow path forming body 240. The signal terminals 221, 222 of each semiconductor module 220 are soldered to the inverter control circuit board 205A to be connected to the driver circuit unit 250. The inverter control circuit board 205A is fixed to the capacitor module 230 with fastening members such as screws. More specifically, the inverter control circuit board 205A is coupled with the capacitor case 230c so as to allow thermal conduction. Accordingly, the heat generated from the electric components implemented on the inverter control circuit board 205A is discharged from the capacitor case 230c, and is also cooled by the flow path forming body 240.

Each semiconductor module 220 attached to the flow path forming body 240 is impregnated with the semiconductor module cooling flow path 243b (see FIG. 6(A)), and is cooled by the refrigerant flowing in the cooling flow path 243. The recessed portion 240f provided on the first side wall 241a of the flow path forming body 240 is sealed by the cover member 240a (see FIG. 8(B)) via a seal member, not shown, and the semiconductor device cooling flow path 243d is formed by the recessed portion 240f and the cover member 240a.

[DC-DC Converter 100]

Figure 7:
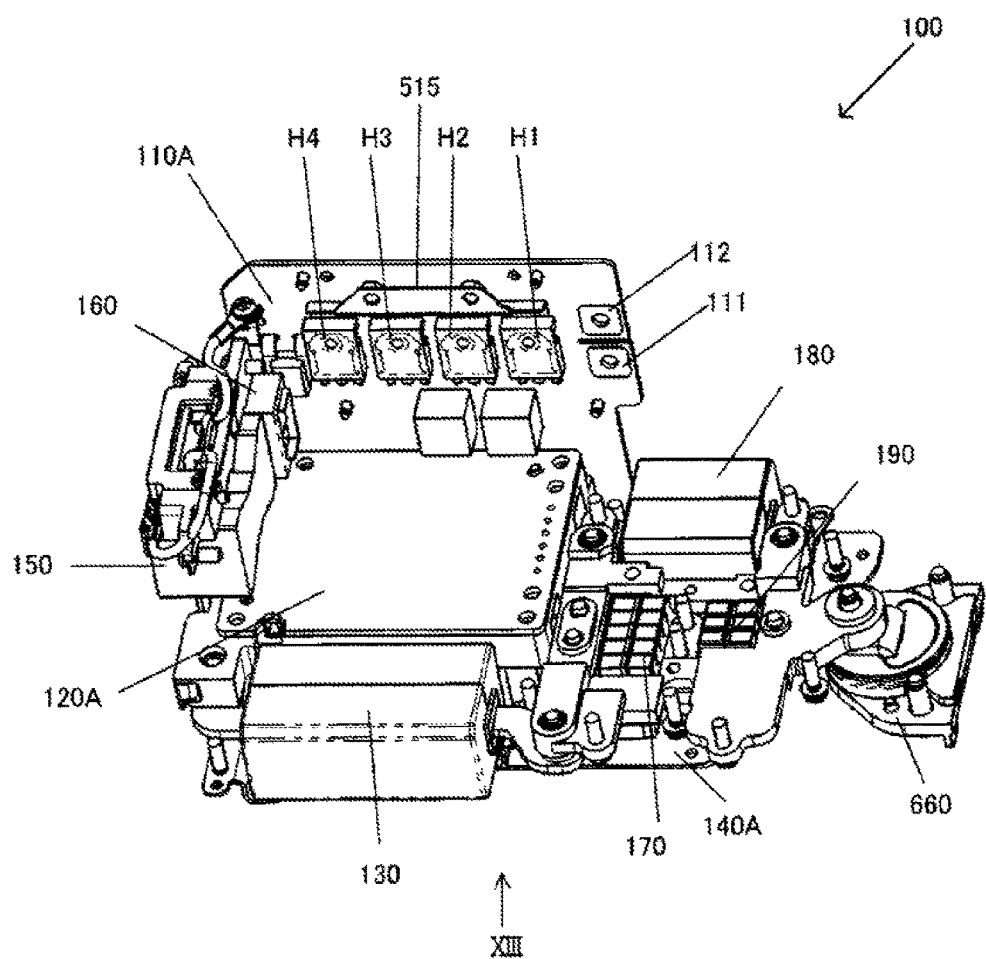
FIG. 7 is a perspective view seen from above according to an embodiment of a converter of the present invention.

FIG. 7 is a perspective view seen from above according to an embodiment of the converter of the present invention. FIG. 8(A) is a perspective view illustrating a state in which the converter as illustrated in FIG. 7 is attached to the flow path forming body. FIG. 8(B) is a perspective view illustrating a state in which a high voltage circuit unit is detached from the state as illustrated in FIG. 8(A).

In the following explanation, FIG. 9 will also be referred to.

The DC-DC converter 100 includes a high voltage circuit unit 110, a low voltage circuit unit 120, and a converter control circuit board 140A.

The high voltage circuit unit 110 includes a high voltage circuit board 110A, and electric components (not shown) such as four MOSFETs H1 to H4 and resistors implemented on the high voltage circuit board 110A.

The MOSFETs H1 to H4 are brought into pressurized contact with the cover member 240a (see FIG. 8(B)) covering the recessed portion 240f provided on the first side wall 241a of the flow path forming body 240 by an elastic plate 515 with a thermally conductive sheet 511 interposed therebetween. The MOSFETs H1 to H4 are connected with connection leads to the high voltage circuit board 110A. As described above, the cover member 240a and the recessed portion 240f provided on the first side wall 241a of the flow path forming body 240 form the semiconductor device cooling flow path 243d in which refrigerant flows. Therefore, the MOSFETs H1 to H4 are efficiently cooled by the refrigerant flowing in the semiconductor device cooling flow path 243d. The high voltage circuit board 110A is attached to the first side wall 241a of the flow path forming body 240 with fastening members such as screws. The coupling between the high voltage circuit board 110A and the flow path forming body 240 is a thermal coupling capable of thermal conduction. Therefore, the heat generated from the high voltage circuit board 110A is effectively cooled by the flow path forming body 240.

In the high voltage circuit board 110A, the input side high and low voltage terminals 111, 112 connected to the capacitor module 230 are provided at the side edge of the high voltage circuit board 110A at the side of the capacitor module 230. The input side high voltage terminal 111 is connected to the positive pole side converter terminal 230l of the capacitor module 230. The input side low voltage terminal 112 is connected to the negative pole side converter terminal 230m of the capacitor module 230.

The high voltage circuit board 110A is arranged in a direction substantially perpendicular to the arrangement direction of the semiconductor module 220, and is attached to the first side wall 241a adjacent to the capacitor module attachment unit 242 of the flow path forming body 240 attached with the capacitor module 230. Therefore, the distance between the capacitor module 230 and the input side high and low voltage terminals 111, 112 of the high voltage circuit board 110A is reduced, and the lengths of the positive and negative pole side converter terminals 230l, 230m of the capacitor module 230 can be shortened.

The direct current positive negative pole terminals 226, 228 (see FIG. 5) of the semiconductor module 220 are arranged to face the component implementation surface of the high voltage circuit board 110A and to be in parallel therewith.

The positive and negative pole side capacitor terminals 230h, 230i (see FIG. 5) of the capacitor module 230 and the positive and negative pole side converter terminals 230l, 230m of the capacitor module 230 are arranged to face the connection surfaces of the direct current positive negative pole terminals 226, 228 and to be in parallel therewith.

When the lengths of the positive and negative pole side converter terminals 230*l*, 230*m* of the capacitor module 230 are reduced, the wiring inductor for connection can be reduced. Therefore, both of the functions of the X capacitor Ci1 and the two Y capacitors Ci2 are achieved by the capacity of the capacitor module 230, so that the three capacitors Ci1, Ci2 can be eliminated. Since the noise during input can be reduced, the normal mode coil Li1 and the common mode coils Li2 can also be eliminated.

More specifically, in FIG. 3, the X and Y capacitor Ci1, Ci2 and the normal and common mode coils Li1, Li2 in the area A in the circuit unit of the DC-DC converter 100 are not implemented on the high voltage circuit board 110A.

The low voltage circuit unit 120 includes a low voltage circuit board 120A, MOSFETs S1, S2 implemented on the low voltage circuit board 120A, active clamp MOSFETs S3, S4, constituting an active clamp circuit, an active clamp capacitor Cc, gate resistors (not shown), and the like.

For example, the low voltage circuit board 120A has such a structure that an insulating film is formed on one surface of a metal board, and a wiring pattern is formed on an insulating film.

Although not shown in the drawings, the MOSFETs S1 to S4 has a package structure in which a switching unit is sealed with resin, and a drain terminal connected to a drain electrode is provided on a surface of resin. The drain terminal of each of the MOSFETs S1 to S4 is soldered to the drain pattern of the metal board.

The low voltage circuit board 120A is attached to an attachment member 512 (see FIG. 9, FIG. 11) in such a manner that the implementation surface of the electronic components such as the MOSFETs S1 to S4 are at the lower side. The low voltage circuit board 120A attached to the attachment member 512 is fixed in such a manner that a surface thereof opposite to the implementation surface is in contact with the area V (see FIG. 6(C)), which is the bottom surface of the flow path forming body 240, directly or with a thermal conduction member interposed therebetween. The cooling flow path 243 in which refrigerant flows is formed in the inside of the lower surface of the flow path forming body 240. Therefore, the heat generated from each of the MOSFETs S1 to S4 is transmitted to the flow path forming body 240 via the metal board, and is cooled by the refrigerant flowing in the cooling flow path 243 provided in the flow path forming body 240.

The recessed portion 245 is formed substantially in the center of the second side wall 241*b* (see FIG. 6(B)), and the area around the recessed portion 245 is the area IV of the flow path forming body 240. As illustrated in FIG. 9, a portion of the transformer 150 (Tr) and the resonant choke coil device 160 (Lr) are implemented to be accommodated in the recessed portion 245 in such a manner that one side surface of each of them is in contact with the bottom surface of the recessed portion 245.

The transformer 150 (Tr) has such a structure that a bobbin having a primary winding wrapped therearound and a secondary winding including a pair of upper and lower windings are sandwiched by a pair of E cores. With a fixing member 513 (see FIG. 9), the transformer 150 (Tr) is fixed to a boss unit of the flow path forming body 240 with a fastening member. The transformer 150 (Tr) is further pressurized by a transformer attachment plate 514 having elasticity from the outside of the fixing member 513. Accordingly, this makes a structure having a high level of vibration resistance. The resonant choke coil device 160 (Lr) is disposed to be in adjacent to the transformer 150 (Tr).

Figure 8:
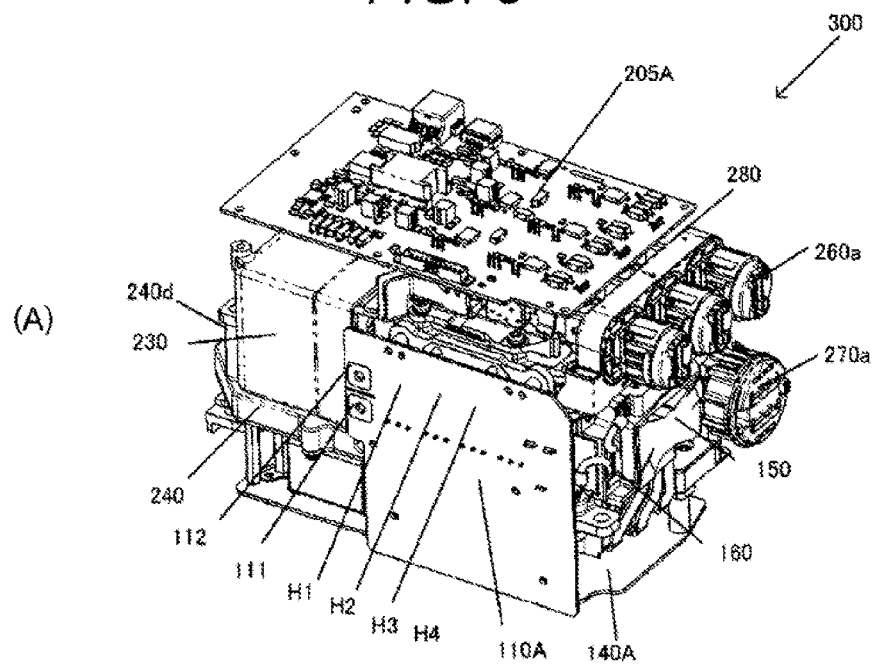
FIG. 8(A) is a perspective view illustrating a state in which the converter as illustrated in FIG. 7 is attached to a flow path forming body.
FIG. 8(B) is a perspective view illustrating a state in which a high voltage circuit unit is detached from the state as illustrated in FIG. 8(A).
Figure 8:
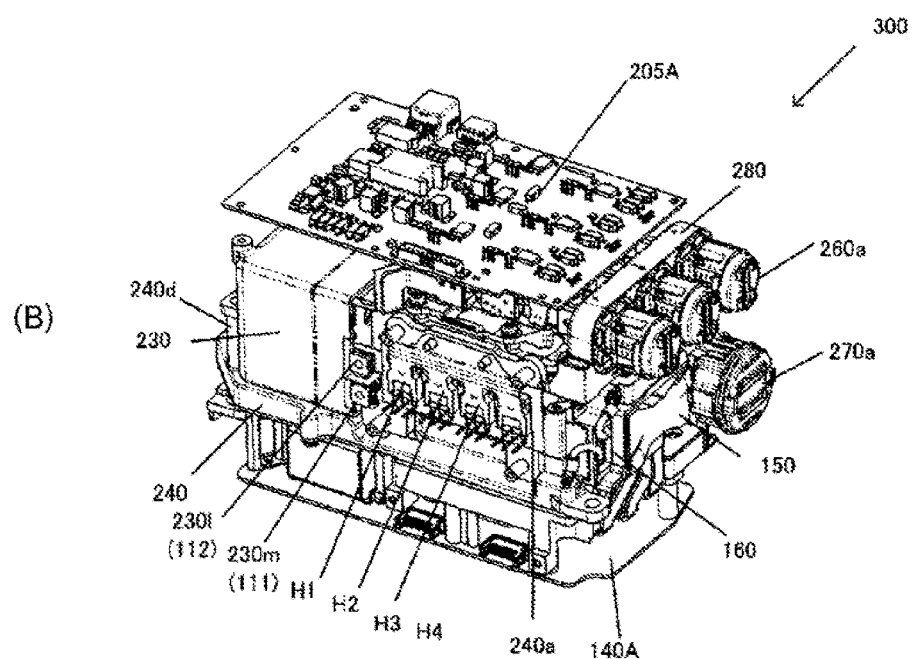

As illustrated in FIG. 9, the electric current sensor 280 constituting the inverter apparatus 200 is arranged in a space between the alternate current terminal 270*a* and the semiconductor module 220 at the side where the resonant choke coil 160 (Lr) and the transformer 150 (Tr) of the flow path forming body 240 are disposed. The alternate current terminal 270*a* having the alternate current connection bus bar 270*b* inserted into the aperture portion of the electric current sensor 280 is disposed outside of the electric current sensor 280. The direct current terminal 260*a* is arranged next to the alternate current terminal 270*a* below the alternate current terminal 270*a* (see FIG. 4(A)). As described above, a part of transformer 150 (Tr) and the resonant choke coil 160 (Lr) are accommodated in the recessed portion 245 formed on the second side wall 241*b*, and as illustrated in FIG. 8, a portion of the transformer 150 (Tr) protruding from the recessed portion 245 is disposed in a gap between the direct current terminal 260*a* and the alternate current terminal 270*a*. With such structure, the size of the electric power conversion apparatus 300 is reduced.

The semiconductor module cooling flow path 243*b* is formed in the inside of the second side wall 241*b* in contact with the transformer 150 (Tr) and the resonant choke coil 160 (Lr). The heat generated from the semiconductor module 220 is high, and therefore, the semiconductor module cooling flow path 243*b* is formed to have a higher level of cooling performance. Therefore, the transformer 150 (Tr) and the resonant choke coil 160 (Lr) in contact with the second side wall 241*b* are efficiently cooled via the second side wall 241*b* by the refrigerant flowing in the semiconductor module cooling flow path 243*b*.

A capacitor board 170A and a filter inductor device 180 (L1) are arranged at the side opposite to the capacitor module attachment unit 242 provided on the flow path forming body 240, i.e., at the side of the converter control circuit board 140A. Smoothing capacitor devices 170 (C0) and filter capacitor devices 190 (C1) are implemented on the capacitor board 170A. The filter inductor device 180 (L1) and the capacitor board 170A are arranged in the area V, which is the bottom surface of the flow path forming body 240, adjacent to the low voltage circuit board 120A. The filter inductor device 180 (L1) is implemented so that the filter inductor device 180 (L1) is in contact with the bottom surface of the flow path forming body 240 or has a thermal conductivity member therebetween to be able to make a thermal conduction with the flow path forming body 240, and accordingly, the filter inductor device 180 (L1) is cooled by the flow path forming body 240. The filter inductor device 180 (L1) and the filter capacitor device 190 (C1) remove a noise superimposed on the output voltage.

At the side opposite to the semiconductor module attachment unit 241 provided on the flow path forming body 240, i.e., at the side of the converter control circuit board 140A, the smoothing inductor device 130 (L0) is arranged at the side opposite to the high voltage circuit board 110A provided on the side wall 240*a* of the flow path forming body 240.

The electronic components constituting the converter control circuit unit 140 are implemented on the converter control circuit board 140A. The converter control circuit board 140A is arranged below the low voltage circuit board 120A.

Figure 10:
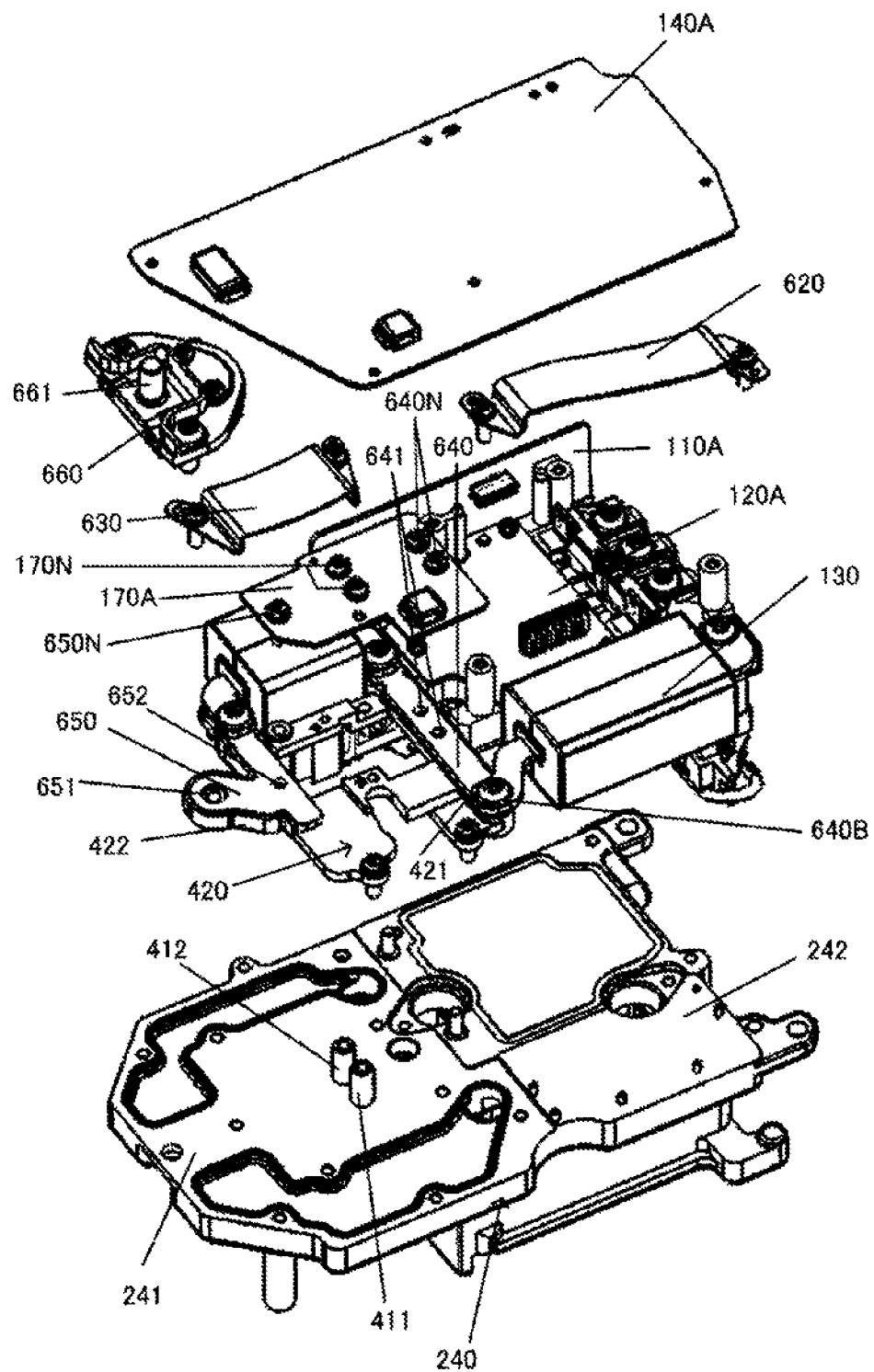
FIG. 10 is an exploded perspective view illustrating the converter as illustrated in FIG. 7 when it is seen from the bottom surface side.
Figure 11:
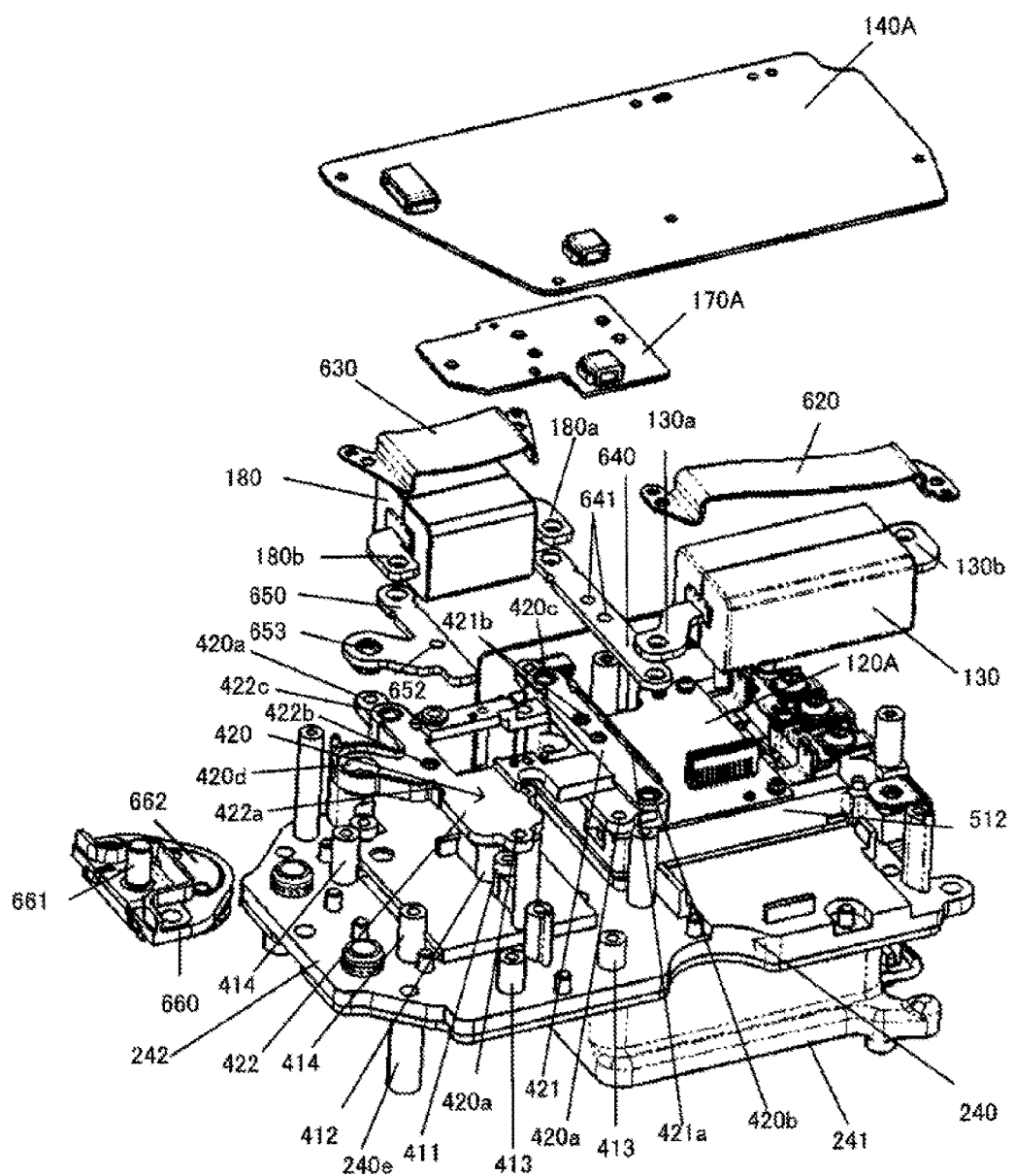
FIG. 11 is an exploded perspective view obtained by further exploding the converter illustrated in FIG. 10.
Figure 12:
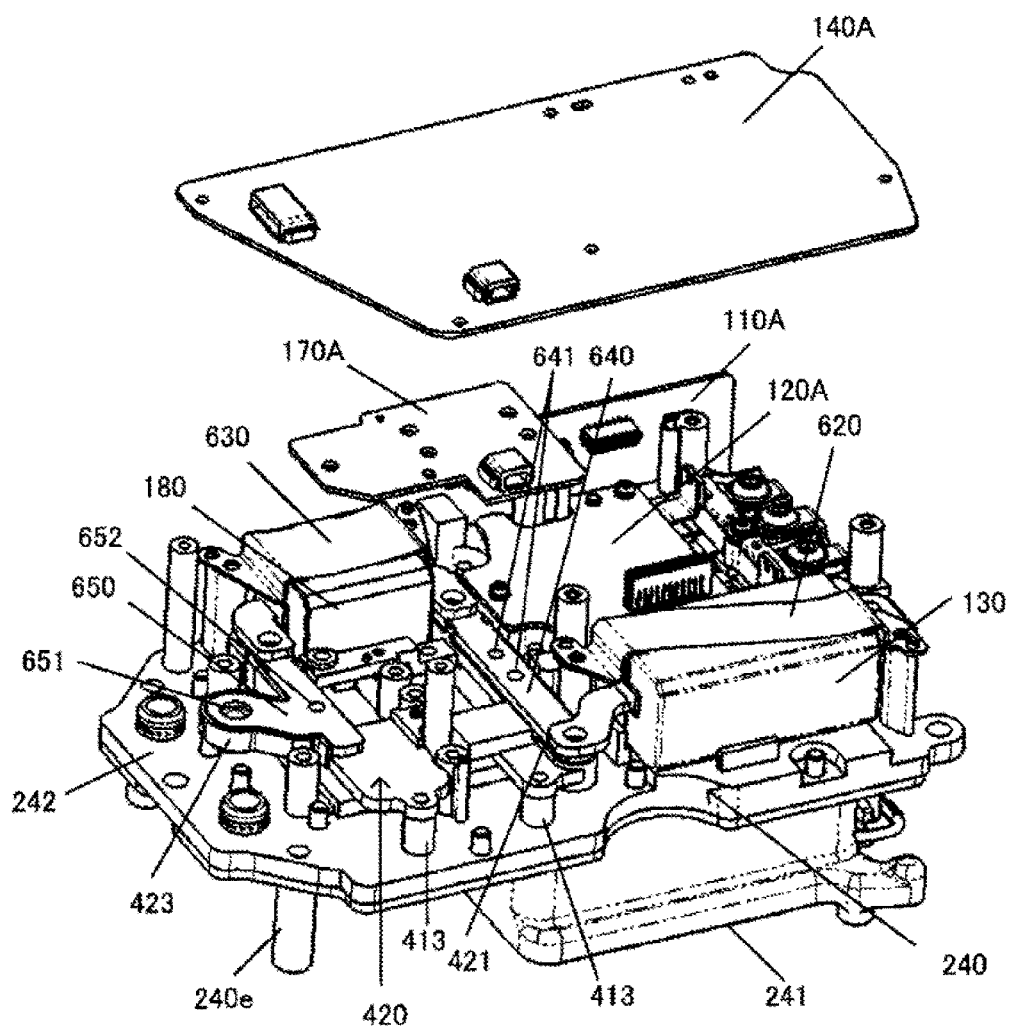
FIG. 12 is a perspective view for explaining an attachment state of the converter illustrated in FIG. 10.
Figure 13:
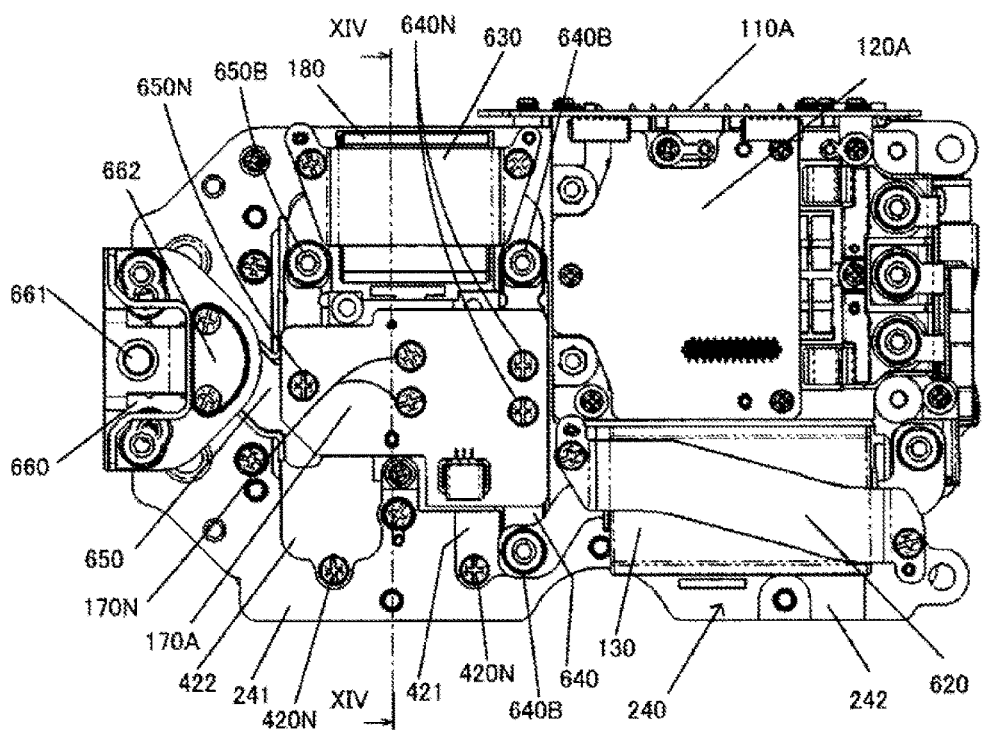
FIG. 13 is a top view illustrating a state in which a converter control circuit board is detached from the converter as illustrated in FIG. 7 when it is seen from the lower surface side.
Figure 14:
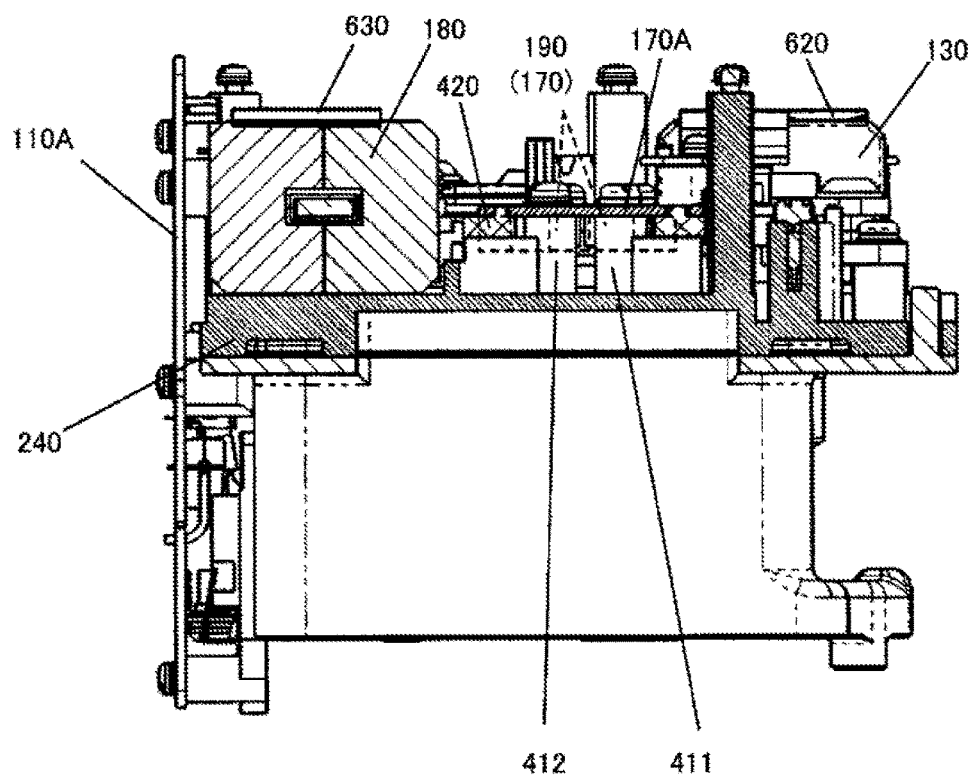
FIG. 14 is a cross sectional view taken along line XIV-XIV of FIG. 13.

In the following explanation, FIG. 10 to FIG. 14 will be referred to. FIG. 10 is an exploded perspective view illustrating the converter as illustrated in FIG. 7 when it is seen from the bottom surface side. FIG. 11 is an exploded perspective view obtained by further exploding the converter illustrated in FIG. 10. FIG. 12 is a perspective view for explaining an attachment state of the converter illustrated in FIG. 10. FIG. 13 is a top view illustrating a state in which the converter control circuit board 140A is detached from the converter as illustrated in FIG. 7 when it is seen from a direction of XIII. FIG. 14 is a cross sectional view taken along line XIV-XIV of FIG. 13. In FIG. 12, a terminal attachment seat 660 as illustrated in FIG. 11 is not shown.

On a surface of the flow path forming body 240 opposite to the converter control circuit board 140A, many protruding portions including protruding portions 411, 412, 413 are formed integrally with the flow path forming body 240 such as aluminum die-cast. The protruding portions 411, 412, 413 are provided to connect the capacitors implemented on the capacitor board 170A to the flow path forming body 240 which is the metal base.

The smoothing capacitor devices 170 (C0) implemented on the capacitor board 170A are set to the ground voltage via the protruding portion 411. The filter capacitor devices 190 (C1) implemented on the capacitor board 170A are set to the ground voltage via the protruding portion 411.

The protruding portion 413 is used as an attachment boss of an insulating attachment member 420. The insulating attachment member 420 is a member made by integrating a first bus bar attachment unit 421 and a second bus bar attachment unit 422. The first bus bar attachment unit 421 is a member for fixing a first bus bar 640 connecting one of the terminals of the smoothing inductor device 130 (L0), i.e., a terminal 130a and one of the terminals of the filter inductor device 180 (L1), i.e., a terminal 180a. The second bus bar attachment unit 422 is a member for fixing a second bus bar 650 connecting the other of the terminals of the filter inductor device 180 (L1), i.e., a terminal 180b, to the output terminal 661 of the terminal attachment seat 660.

The first and second bus bars 640, 650 to which the capacitors 170, 190, respectively, of the capacitor board 170A are electrically connected are held on the insulating attachment member 420, and therefore, first, the structures of the insulating attachment member 420 and the bus bars 640, 650 will be explained.

As illustrated in FIG. 11, the insulating attachment member 420 is a member including the first bus bar attachment unit 421 and the second bus bar attachment unit 422 integrally formed with insulating resin. As illustrated in FIG. 12, in the insulating attachment member 420, screws 420B (see FIG. 13) are inserted into multiple penetration holes 420a (see FIG. 11) to be screwed with female screws provided on the upper surface of the protruding portion 413, so that the insulating attachment member 420 is attached to the bottom surface of the flow path forming body 240.

The first bus bar 640 connecting one of the terminals of the smoothing inductor device 130 (L0), i.e., the terminal 130a and one of the terminals of the filter inductor device 180 (L1), i.e., the terminal 180a, is held on the first bus bar attachment unit 421. The first bus bar 640 is made of, for example, copper.

Female screw units 420b, 420c are provided at both ends of the first bus bar attachment unit 421. A bolt 640B (see FIG. 13) inserted into one of the terminals of the smoothing inductor device 130 (L0), i.e., the terminal 130a, is screwed into a female screw unit 420b, so that one of the terminals of the smoothing inductor device 130 (L0), i.e., the terminal 130a, is coupled with the first bus bar 640. The bolt 640B (see FIG. 13) inserted into one of the terminals of the filter inductor device 180 (L1), i.e., the terminal 180a, is screwed into a female screw unit 420c, so that one of the terminals of the filter inductor device 180 (L1), i.e., the terminal 180a, is coupled with the first bus bar 640.

The smoothing inductor device 130 (L0) is pressed from its upper surface by a first flat spring 620 to be held on the flow path forming body 240.

The second bus bar 650 made of, e.g., copper, is provided above the second bus bar attachment unit 422. Female screw units 422b, 422c are formed in the second bus bar attachment unit 422.

A bolt 650B is inserted into the penetration holes of the other of the terminals of the filter inductor device 180 (L1), i.e., the terminal 180b, and the second bus bar 650, so that the bolt 650B is screwed into the female screw unit 422c of the second bus bar attachment unit 422. Therefore, the second bus bar 650 is arranged above the second bus bar attachment unit 422. The filter inductor device 180 (L1) is pressed and held by a second flat spring 630 onto the flow path forming body 240.

Guide side walls 421a, 422a for engaging with the first bus bar 640 and the second bus bar 650 are formed on the first bus bar attachment unit 421 and the second bus bar attachment unit 422, respectively. When the first bus bar 640 and the second bus bar 650 are arranged along the inner side of the guide side walls 421a, 422a, respectively, the first bus bar 640 and the second bus bar 650 can be efficiently positioned with respect to the first bus bar attachment unit 421 and the second bus bar attachment unit 422, respectively.

As shown in FIG. 11, the second bus bar 650 is formed with a branch portion branched into a Y shape, and a female screw-attached boss unit 653 is provided at the end side of the branch portion. The female screw-attached boss unit 653 is protruding to the lower surface side, and the protruding portion of this female screw-attached boss unit 653 is engaged with a recessed portion 420d provided in the second bus bar attachment unit 422. As shown in FIG. 11 and FIG. 13, the terminal attachment seat 660 is disposed above the female screw-attached boss unit 653 of the second bus bar 650 disposed above the second bus bar attachment unit 422.

The terminal attachment seat 660 is made of an insulating material, and an output terminal 661 made of a conductive member is formed on the terminal attachment seat 660 so as to protrude to the upper side of the terminal attachment seat 660 in FIG. 11. A lid portion 662 is provided at the right side of the output terminal 661 of the terminal attachment seat 660 in FIG. 11. Although not shown in the drawing, a male screw-attached terminal and a connection conductive body electrically connecting the male screw-attached terminal and the terminal output terminal 661 are provided in the inside of the lid portion 662. When the male screw-attached terminal is screwed into the female screw unit of the female screw-attached boss unit 653, the second bus bar 650 and the output terminal 661 are electrically connected.

It should be noted that the portions of the first bus bar 640, the second bus bar 650, and the output terminal 661 in the circuit diagrams are shown in FIG. 3.

As described above, the capacitor board 170A is disposed in the space between the converter control circuit board 140A and the capacitor module attachment unit 242 of the flow path forming body 240.

Figure 15:
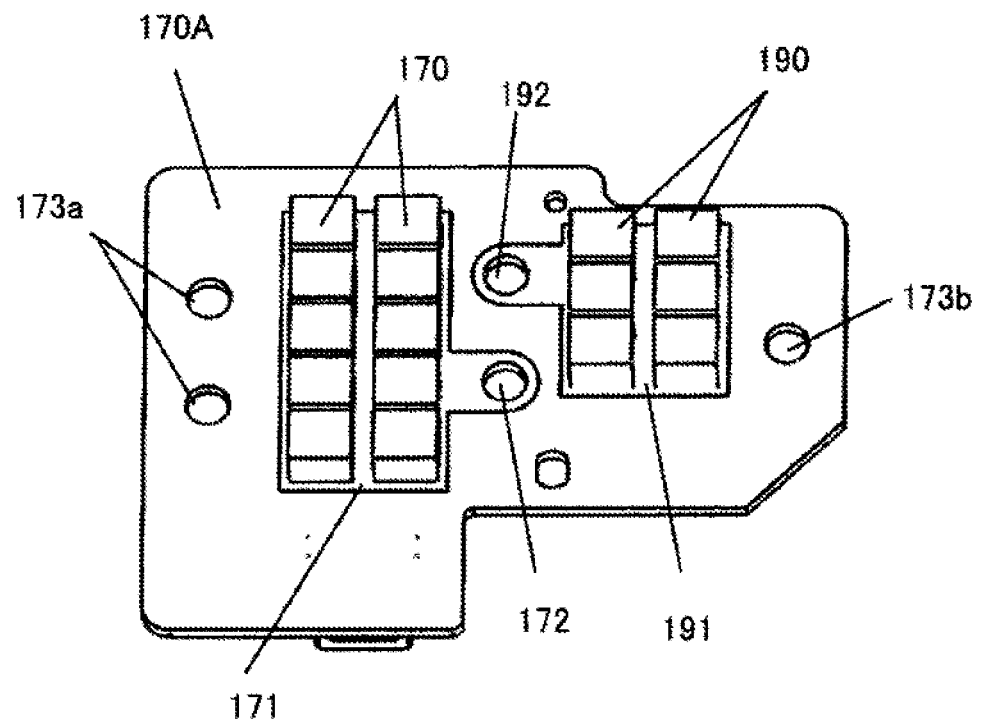
FIG. 15 is a perspective view illustrating a capacitor board when it is seen from a flow path forming body side.

FIG. 15 is a perspective view illustrating the capacitor board 170A when it is seen from the side of the flow path forming body 240.

Multiple smoothing capacitor devices 170 (C0) and multiple filter capacitor devices 190 (C1) are implemented on a surface of the capacitor board 170A. A first ground pattern 171 and a second ground pattern 191 are formed on a surface of the capacitor board 170A. One end of each smoothing capacitor device 170 (C0) is connected to the first ground pattern 171. One end of each filter capacitor device 190 (C1) is connected to the second ground pattern 191.

The capacitor board 170A is provided with a penetration hole 172 provided in the area of the first ground pattern 171 and a penetration hole 192 provided in the area of the second ground pattern 191. The capacitor board 170A is provided with three penetration holes 173a, 173b. One surface of the capacitor board 170A is placed on the first bus bar 640 and the second bus bar 650, so that the capacitor board 170A is fixed and held on the insulating attachment member 420.

More specifically, a screw 640N (see FIG. 13) is inserted into the penetration hole 173a of the capacitor board 170A and two penetration holes 641 of the first bus bar 640, so that the first bus bar 640 is sandwiched between the capacitor board 170A and the insulating attachment member 420. More specifically, the positive pole of the smoothing capacitor device 170 (C0) is electrically connected to the first bus bar 640.

A screw 650N (see FIG. 13) is inserted into the penetration hole 173b of the capacitor board 170A and a single penetration hole 651 of the second bus bar 650, so that the second bus bar 650 is sandwiched between the capacitor board 170A and the insulating attachment member 420. Accordingly, the filter capacitor device 190 (C1) is electrically connected to the second bus bar 650.

Further, the capacitor board 170A is fastened to the protruding portions 411, 412 with screws 170N (see FIG. 13) in such a state that one surface of the capacitor board 170A faces the side of the flow path forming body 240, and the peripheral portion of the penetration hole 172 of the first ground pattern 171 is in contact with the upper surface of the protruding portion 411, and the peripheral portion of the penetration hole 192 of the second ground pattern 191 is in contact with the upper surface of the protruding portion 412. A top view illustrating the capacitor board 170A fixed to the protruding portions 411, 412 is shown in FIG. 13.

Accordingly, the first ground pattern 171 connected to one end of each smoothing capacitor device 170 (C0) is electrically connected via the protruding portion 411 to the flow path forming body 240. The second ground pattern 191 connected to one end of each filter capacitor device 190 (C1) is electrically connected via the protruding portion 412 to the flow path forming body 240. Each smoothing capacitor device 170 (C0) and each filter capacitor device 190 (C1) are grounded via the flow path forming body 240. More specifically, each smoothing capacitor device 170 (C0) and each filter capacitor device 190 (C1) are electrically connected to the flow path forming body 240 via different paths.

The lengths of the protruding portions 411, 412 are such lengths that each filter capacitor device 190 (C1) and each smoothing capacitor device 170 (C0) implemented on the capacitor board 170A are not in contact with the flow path forming body 240 while the capacitor board 170A is fixed on the protruding portions 411, 412.

Therefore, as illustrated in FIG. 14, a space is formed between the filter capacitor device 190 (C1) and each smoothing capacitor device 170 (C0) and the flow path forming body 240.

According to the DC-DC converter 100 of an embodiment explained above, the following effects are achieved.

(1) Each smoothing capacitor device 170 (C0) and each filter capacitor device 190 (C1) are collectively installed on the capacitor board 170A, and are separated from the smoothing inductor device 130 (L0) and the filter inductor device 180 (L1) which are heat generating bodies. A space is formed between each smoothing capacitor device 170 (C0) and each filter capacitor device 190 (C1) and the flow path forming body 240. More specifically, an air layer is interposed between them and the flow path forming body 240. Therefore, the heat of the flow path forming body 240 generated by the heat generating bodies such as the smoothing inductor device 130 (L0) and the filter inductor device 180 (L1) is not directly transmitted to each smoothing capacitor device 170 (C0) and each filter capacitor device 190 (C1), and is transmitted via the protruding portions 411, 412. Accordingly, the heat quantity transmitted to each smoothing capacitor device 170 (C0) and each filter capacitor device 190 (C1) can be reduced, and an adverse effect on each smoothing capacitor device 170 (C0) and each filter capacitor device 190 (C1) caused by heat can be suppressed.

(2) The insulating attachment member 420 for arranging the first bus bar 640 and the second bus bar 650 has the first bus bar attachment unit 421 and the second bus bar attachment unit 422 integrally formed therewith. Therefore, this makes the assembly easier, and improves the workability. In this structure, the guide side walls 421a, 422a for engaging with the first bus bar 640 and the second bus bar 650 are formed on the first bus bar attachment unit 421 and the second bus bar attachment unit 422, respectively. The first bus bar 640 and the second bus bar 650 are arranged along the inside of the guide side walls 421a, 422a, respectively, so that the first bus bar 640 and the second bus bar 650 can be efficiently positioned with respect to the first bus bar attachment unit 421 and the second bus bar attachment unit 422, respectively.

(3) Each smoothing capacitor device 170 (C0) and each filter capacitor device 190 (C1) are implemented on the single capacitor board 170A. The capacitor board 170A is formed with the first and second ground patterns 171, 191 connected to one end of each of the smoothing capacitor device 170 (C0) and the filter capacitor devices 190 (C1). Each smoothing capacitor device 170 (C0) and each filter capacitor device 190 (C1) are grounded via the protruding portions 411, 412 and the flow path forming body 240 by just fastening the capacitor board 170A with the protruding portions 411, 412 by using fastening members, i.e., screws 170A. Therefore, this provides a high level of workability.

(4) The first bus bar 640 and the second bus bar 650 are attached to the insulating attachment member 420 integrated into the single member. Therefore, this provides a high level of workability in assembly.

(5) The insulating attachment member 420 integrated into the single member is supported by the protruding portion 413 provided in a protruding manner from the metal base 240, and the first bus bar 640 and the second bus bar 650 are attached to the insulating attachment member 420. The capacitor board 170 is fixed to the first bus bar 640 and the second bus bar 650 held on the insulating attachment member 420, and is disposed to extend between both of the bus bars. The protruding portions 411, 412 are provided in a protruding manner from the bottom surface of the metal base 240 located between the first bus bar 640 and the second bus bar 650. The first and second ground patterns 171, 191 provided at the central portion of the capacitor board 170A are electrically connected to the protruding portions 411, 412.

Due to this configuration, a high level of workability in assembly is provided when the ground patterns of the capacitors 170, 190 are electrically connected to the metal base 240.

(6) One end of each smoothing capacitor device 170 (C0) is electrically connected via the protruding portion 411 to the flow path forming body 240 to be grounded, and one end of each filter capacitor device 190 (C1) is electrically connected via the protruding portion 412 to the flow path forming body 240 to be grounded. More specifically, the paths in which each smoothing capacitor device 170 (C0) and each filter capacitor device 190 (C1) are grounded to the flow path forming body 240 are different. When the ground pattern of the smoothing capacitor device 170 (C0) and the ground pattern of the filter capacitor device 190 (C1) are the same, the noises interfere with each other, so that a noise electric current is more likely to be discharged from the output terminal 661. In contrast, in an embodiment explained above, the ground patterns of the smoothing capacitor device 170 (C0) and the filter capacitor device 190 (C1) are independently from each other, and therefore, noises do not interfere with each other, and the output noises can be reduced.

However, in a case where an interference noise of the smoothing capacitor device 170 (C0) and the filter capacitor device 190 (C1) is small, a ground pattern common to both of them may be provided.

Figure 16:
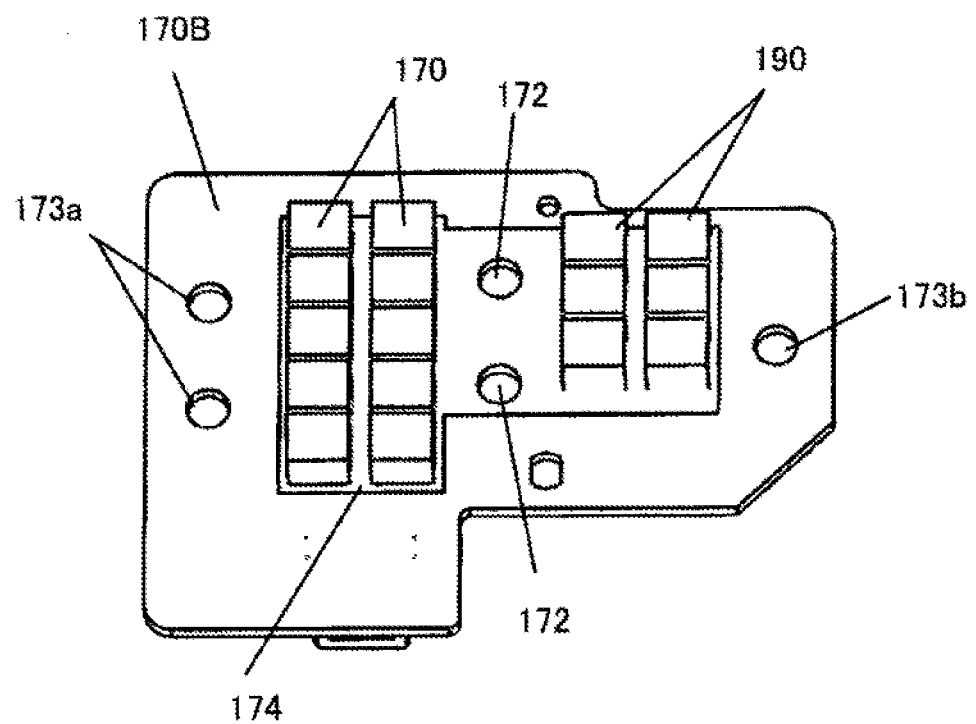
FIG. 16 is a perspective view illustrating a modification of a capacitor board.

FIG. 16 is a perspective view illustrating an example of the capacitor board 170B as described above.

On the capacitor board 170B as illustrated in FIG. 16, the single common ground pattern 174 connected to all of the one end of each smoothing capacitor device 170 (C0) and the one end of each filter capacitor device 190 (C1) is formed. On the capacitor board 170B, two penetration holes 172 in the area of the ground pattern 174 are formed. Like the capacitor board 170A, the capacitor board 170B is fixed on the protruding portions 411, 412 with the fastening member inserted into each penetration hole 172 of the capacitor board 170B.

There may be a single penetration hole 172 provided in the area of the ground pattern 174 of the capacitor board 170B. In this case, only one of the protruding portions 411, 412 may be provided.

Each smoothing capacitor device 170 (C0) and each filter capacitor device 190 (C1) may have a structure in which each smoothing capacitor device 170 (C0) and each filter capacitor device 190 (C1) are implemented on a surface at a side opposite to the flow path forming body 240 of the capacitor boards 170A, 170B. One of each smoothing capacitor device 170 (C0) and each filter capacitor device 190 (C1) may be implemented on a surface at a side facing the flow path forming body 240 of the capacitor boards 170A, 170B, and the other thereof may be implemented on a surface opposite thereto.

In an embodiment explained above, the protruding portions 411, 412 for attaching the capacitor board 170A have such a structure that the protruding portions 411, 412 are integrally formed with the flow path forming body 240. However, the protruding portions 411, 412 may have such a structure that the protruding portions 411, 412 are formed as a member separate from the flow path forming body 240 to be attached to the flow path forming body 240.

The protruding portions 411, 412 may be made of an insulating member. In a case where the protruding portions 411, 412 are made of an insulating member, the flow path forming body 240 and the ground patterns 171, 191, 174 formed on the capacitor boards 170A, 170B may be connected by a conductive body. In this case, the first ground pattern 171 connected to the smoothing capacitor device 170 (C0) and the second ground pattern 191 connected to the filter capacitor device 190 (C1) may have such a structure that the first ground pattern 171 connected to the smoothing capacitor device 170 (C0) and the second ground pattern 191 connected to the filter capacitor device 190 (C1) are separated, and the first ground pattern 171 connected to the smoothing capacitor device 170 (C0) and the second ground pattern 191 connected to the filter capacitor device 190 (C1) may be connected respectively by another conductive body.

An embodiment explained above showed a structure as an example in which the capacitor boards 170A, 170B having the smoothing capacitor device 170 (C0) and the filter capacitor device 190 (C1) implemented thereon are placed on the upper surfaces of the protruding portions 411, 412. However, step portions may be provided at intermediate portions in a length direction of the protruding portions 411, 412, and the capacitor boards 170A, 170B may be placed on the step portions.

The present invention is configured so that a predetermined space is ensured between the capacitor board 170A and the metal base 240, and the effect of heat to the capacitors 170, 190 is reduced. In the present invention, any installation member may be used as a structure for lifting the capacitor board 170A from the metal base 240.

An embodiment explained above showed a structure as an example in which the flow path forming body 240 is provided with the cooling flow path in which cooling agent such as cooling water flows. However, the flow path forming body 240 is a metal base member cooled by cooling gas such as air.

The DC-DC converter 100 according to an embodiment explained above includes the smoothing inductor device 130 (L0), the filter inductor device 180 (L1), the smoothing capacitor device 170 (C0), and the filter capacitor device 190 (C1). However, there may be a DC-DC converter not including a filter inductor device 180 (L1) or a filter capacitor device 190 (C1), and the present invention can be applied to such DC-DC converter. The present invention is not limited to the DC-DC converter, and can be applied to a converter such as an AC-DC converter.

The assembly structure of the high voltage circuit unit 110 having the high voltage circuit board 110A, the low voltage circuit unit 120 having the low voltage circuit board 120A, and the converter control circuit board 140A, and the like in the DC-DC converter 100 explained above is shown as an example, and the present invention is not limited to the structure shown as the example. The present invention can be applied in such a manner that the structure and the shape of each member are in various manners, and can be modified in preferable modes in accordance with the shape, the structure, the performance, or the number of employed electronic components.

Therefore, the present invention also includes a converter including a smoothing inductor 130 provided and cooled on a metal base 240, a smoothing capacitor 1170 implemented on a capacitor board 170, and installation members 411 412 installing a capacitor board 170 on the metal base 240 so that a predetermined space is ensured between the capacitor board 170 and the metal base 240.

An electric power conversion apparatus 300 according to the present invention includes, for example, a DC-DC converter 100 including a metal base 240 provided with a refrigerant flow path, a smoothing inductor 130 mounted on the metal base 240 and cooled by refrigerant in the refrigerant flow path, a smoothing capacitor 170 implemented on a capacitor board 170, and installation members 411, 412 for installing the capacitor board 170A onto the metal base 240 so that a predetermined space is ensured between the capacitor board 170A and the metal base 240, a power module 220 converting from a direct current electric power into an alternate current electric power, converting the alternate current electric power into a direct current electric power, and cooled by being inserted into the refrigerant flow path of the metal base 240, and a smoothing capacitor 230 provided at a stage before the power module 220 and cooled by refrigerant of the refrigerant flow path.

In the electric power conversion apparatus 300 configured as described above, the capacitors 170, 190 of the converter 100 are prevented from being heated by heat given by the metal base 240.

REFERENCE SIGNS LIST 10 vehicle
100 DC-DC converter
110 high voltage circuit unit
110A high voltage circuit board
120 low voltage circuit unit
120A low voltage circuit board
130 smoothing inductor device
140 converter control circuit unit
140A converter control circuit board
150 transformer
160 resonant choke coil
170 smoothing capacitor device
170A, 170B capacitor board
171 first ground pattern
174 ground pattern
180 filter inductor device
190 filter capacitor device
191 second ground pattern
200 inverter apparatus
205 inverter control circuit unit
205A inverter control circuit board
220 semiconductor module
230 capacitor module
230c capacitor case
230d recessed portion
230h positive pole side capacitor terminal
230i negative pole side capacitor terminal
230j positive pole side power source terminal
230k negative pole side power source terminal
230l positive pole side converter terminal
230m negative pole side converter terminal
240 flow path forming body (metal base)
243 cooling flow path
300 electric power conversion apparatus
411, 412 protruding portion (installation member)
420 insulating attachment member
421 first bus bar attachment unit
422 second bus bar attachment unit
640 first bus bar
650 second bus bar
660 terminal attachment seat
661 output terminal
H1 to H4 MOSFET
S1 to S4 MOSFET

The invention claimed is:

1. A converter comprising:
a smoothing inductor provided and cooled on a metal base;
a smoothing capacitor implemented on a capacitor board;
an installation member installing the capacitor board on the metal base so that a predetermined space is ensured between the capacitor board and the metal base,
wherein the capacitor board is provided with a ground pattern connected to one end of the smoothing capacitor,
the installation member is made of a conductive material,
the ground pattern is electrically connected to the metal base by the installation member;
a filter capacitor implemented on the capacitor board; and
a filter inductor mounted on the metal base and constituting a noise filter together with the filter capacitor,
wherein the ground pattern includes a first ground pattern connected to one end of the smoothing capacitor and a second ground pattern connected to one end of the filter capacitor, and
the first and second ground patterns are electrically connected via the installation member to the metal base.

2. The converter according to claim 1, wherein the installation member includes a first installation member for connecting the first ground pattern to the metal base and a second installation member for connecting the second ground pattern to the metal base, and
the first ground pattern and the second ground pattern are electrically connected to the metal base via different paths.

3. The converter according to claim 1, further comprising:
a first bus bar connecting the smoothing inductor and the filter inductor and connected to the other end of the smoothing capacitor;
a second bus bar connecting the filter inductor to an output terminal and connected to the other end of the filter capacitor;
a first insulating attachment member fixed to the metal base and holding the first bus bar; and
a second insulating attachment member fixed to the metal base and holding the second bus bar,
wherein the first insulating attachment member and the second insulating attachment member are formed to be integrated as a single member.

4. The converter according to claim 2, further comprising:
a first bus bar connecting the smoothing inductor and the filter inductor and connected to the other end of the smoothing capacitor;
a second bus bar connecting the filter inductor to an output terminal and connected to the other end of the filter capacitor;
a first insulating attachment member fixed to the metal base and holding the first bus bar; and
a second insulating attachment member fixed to the metal base and holding the second bus bar,
wherein the capacitor board is extended between the first bus bar and the second bus bar, and
the first installation member and the second installation member are electrically connected to the first and second ground pattern at a central portion of a capacitor board extended between the first bus bar and the second bus bar.

5. The converter according to claim 1, wherein the metal base is formed with a flow path in which refrigerant flows.

6. An electric power conversion apparatus comprising:
the converter according to claim 5;
a power module inserted into the refrigerant flow path of the metal base and electrically converting an electric power between a direct current electric power and an alternate current electric power; and
the smoothing capacitor arranged in contact with the metal base and provided at a stage before the power module.

* * * * *